US012641174B2

(12) United States Patent
Huo et al.

(10) Patent No.: US 12,641,174 B2
(45) Date of Patent: May 26, 2026

(54) DECORATING PART, HOUSING OF ELECTRONIC DEVICE, AND ELECTRONIC DEVICE

(71) Applicant: Honor Device Co., Ltd., Shenzhen (CN)

(72) Inventors: Wenlong Huo, Shenzhen (CN); Tuo Li, Shenzhen (CN); Jiuliang Gao, Shenzhen (CN); Haifei Li, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 432 days.

(21) Appl. No.: 17/999,529

(22) PCT Filed: May 26, 2022

(86) PCT No.: PCT/CN2022/095326

§ 371 (c)(1),
(2) Date: Nov. 21, 2022

(87) PCT Pub. No.: WO2023/010963

PCT Pub. Date: Feb. 9, 2023

(65) Prior Publication Data

US 2024/0187509 A1     Jun. 6, 2024

(30) Foreign Application Priority Data

Aug. 6, 2021     (CN) .......................... 202110904532.8

(51) Int. Cl.
*H04M 1/02*      (2006.01)
*H05K 5/02*      (2006.01)

(52) U.S. Cl.
CPC ........ *H04M 1/0283* (2013.01); *H05K 5/0243* (2013.01)

(58) Field of Classification Search
CPC .. H04M 1/0283; H05K 5/0243; H05K 5/0086
See application file for complete search history.

(56) References Cited

U.S. PATENT DOCUMENTS 10,696,091 B2      6/2020   Jian
10,874,153 B2 *  12/2020   Kronenberger ......... B32B 5/024
(Continued)

FOREIGN PATENT DOCUMENTS

CN           103310705 A   *   9/2013
CN           203276723 U       11/2013
(Continued)

*Primary Examiner* — Angelica Perez
(74) *Attorney, Agent, or Firm* — Slater Matsil, LLP

(57)               ABSTRACT

A decoration part includes: a bearing layer, at least one first structural part, and at least one second structural part. The bearing layer includes an upper surface and a lower surface. The at least one first structural part is disposed on the upper surface of the bearing layer. An edge of an upper surface of one first structural part forms a first closed connection line, and the upper surface of the first structural part is a surface that is of the first structural part and that is away from the bearing layer. Each second structural part is disposed on the upper surface of the first structural part and located in a region enclosed by the first closed connection line. The second structural part includes an upper surface and a lower surface that are arranged successively.

17 Claims, 16 Drawing Sheets

(56)          References Cited

U.S. PATENT DOCUMENTS

2006/0212993  A1*   9/2006  Wang ....................... A42C 5/00
                                                                2/171
2008/0141567  A1*   6/2008  Chen ..................... A42B 1/248
                                                                40/1.5
2017/0143060  A1     5/2017  Ronald
2022/0377163  A1    11/2022  Shizhe et al.

FOREIGN PATENT DOCUMENTS

CN        204795924  U      11/2015
CN        204887779  U      12/2015
CN        205365001  U       7/2016
CN        106790782  A       5/2017
CN        111295062  A       6/2020
CN        211152410  U       7/2020
CN        213815284  U   *   7/2021
CN        114466540  A       5/2022
WO       2014169508  A1     10/2014
WO       2021052090  A1      3/2021

* cited by examiner

100

81

A-A'

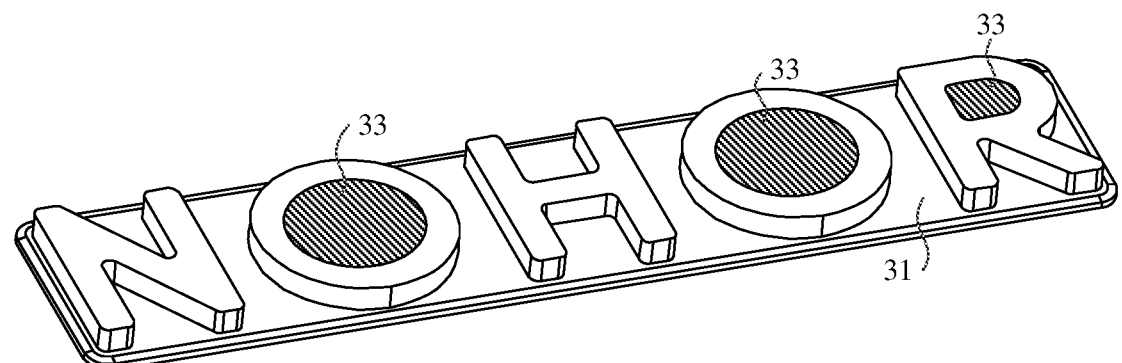
FIG. 5A
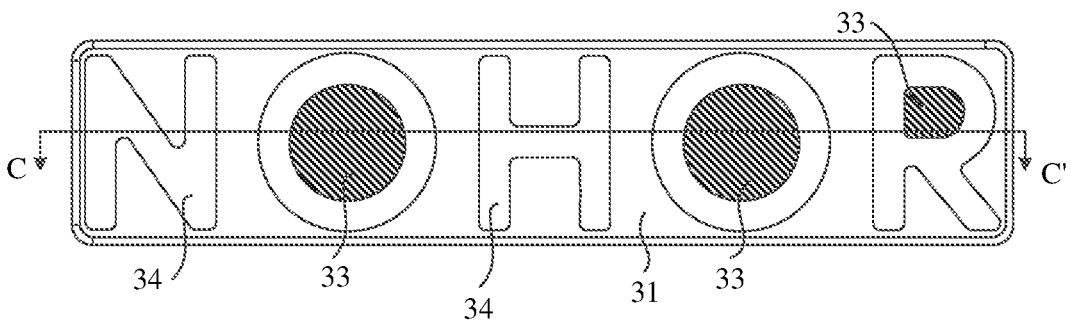
FIG. 5B
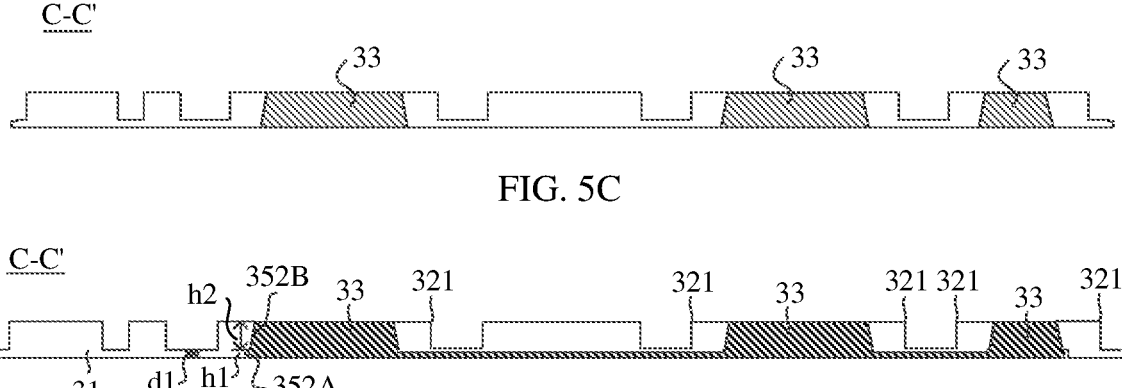
FIG. 5C
FIG. 5D

D-D'

DECORATING PART, HOUSING OF ELECTRONIC DEVICE, AND ELECTRONIC DEVICE

CROSS-REFERENCE TO RELATED APPLICATIONS

This application is a national stage of International Application No. PCT/CN2022/095326, filed on May 26, 2022, which claims priority to Chinese Patent Application No. 202110904532.8, filed on Aug. 6, 2021. The disclosures of both of the aforementioned application are hereby incorporated by reference in their entireties.

TECHNICAL FIELD

This application relates to the field of electronic device manufacturing technologies, and in particular, to a decoration part, a housing of an electronic device, and an electronic device.

BACKGROUND

A decoration part is an important component on a terminal product. A function of the component may be an appearance decoration function, and certainly also may be an identification function, for example, a LOGO, a trademark, or other identification information. The component is mainly used on a housing of the terminal product.

SUMMARY

A main objective of this application is to provide a decoration part, a housing of an electronic device, and an electronic device, so as to improve firmness of combination between the decoration part and a base layer, to avoid falling, and improve an appearance.

To achieve the foregoing objective, the present invention uses the following technical solution.

According to a first aspect, this application provides a decoration part for a housing of an electronic device, and the decoration part includes: a bearing layer, at least one first structural part, and at least one second structural part. The bearing layer includes an upper surface and a lower surface. The at least one first structural part is disposed on the upper surface of the bearing layer. An edge of an upper surface of the first structural part forms a first closed connection line, and the upper surface of the first structural part is a surface that is of the first structural part and that is away from the bearing layer. Each second structural part is disposed on the upper surface of the first structural part and located in a region enclosed by the first closed connection line; along a direction that is directed from the upper surface to the lower surface of the bearing layer, the second structural part includes an upper surface and a lower surface that are arranged successively, an edge of the upper surface of the second structural part forms a second closed connection line; and the first closed connection line and the second closed connection line do not overlap at least in part.

Because the edge of the upper surface of the first structural part forms the first closed connection line, the edge of the upper surface of the second structural part forms the second closed connection line, and the second structural part is located in the region enclosed by the first closed connection line, the first structural part and the at least one second structural part may be regarded as a pattern part, and a pattern represented by the pattern part may be a letter, a Chinese character, a numeral, or another pattern.

For example, the pattern represented by the pattern part is a letter "O". The pattern part may include the first closed connection line and one second closed connection line disposed within the first closed connection line, the first closed connection line corresponds to an outer ring of the letter "O", and the second closed connection line corresponds to an inner ring of the letter "O".

For example, the pattern represented by the pattern part is a letter "B". The pattern part may include the first closed connection line and two second closed connection lines disposed within the first closed connection line, the first closed connection line corresponds to an outer ring of the letter "B", and the two second closed connection lines respectively correspond to two inner rings of the letter "B".

In an implementation of the first aspect, the decoration part further includes at least one third structural part disposed on the upper surface of the bearing layer, an edge of an upper surface of the third structural part forms a third closed connection line, and the upper surface of the third structural part is a surface that is of the third structural part and that is away from the bearing layer. Different from the pattern part, a pattern represented by the third structural part includes only one closed connection line. For example, the third structural part may be a pattern part of a letter "N".

In this way, any pattern including the first closed connection line and at least one second closed connection line disposed within the first closed connection line may be regarded as a first pattern. For example, letters "O", "A", "B", "D", "P", "Q", and "R" are all first patterns. Any pattern including the third closed connection line may be regarded as a second pattern. For example, letters "N", "C", "F", "L", and "H" are all second patterns.

In addition, it should be noted that the foregoing shows only a case in which the first closed connection line and the second closed connection line do not overlap at all, and a person skilled in the art can understand that the first closed connection line and the second closed connection line may alternatively partially overlap. For example, the second closed connection line in the letter "O" moves upward to partially overlap the first closed connection line, that is, the outer ring is tangent to the inner ring, and a pattern formed in this way is also applicable herein.

In an implementation of the first aspect, the first structural part, the third structural part, and the bearing layer are of an integral structure.

In an implementation of the first aspect, a digging hole is provided in the upper surface of the first structural part and located in the region enclosed by the first closed connection line, and the second structural part is disposed in the digging hole. The digging hole is formed in the upper surface of the first structural part, and the second structural part is disposed in the digging hole. Therefore, if the upper surface of the second structural part protrudes out of the digging hole, an edge that is of the digging hole and that is on the upper surface of the first structural part may not overlap the edge of the upper surface of the second structural part; or if the upper surface of the second structural part is flush with the upper surface of the first structural part, the edge that is of the digging hole and that is on the upper surface of the first structural part may be regarded as the edge of the upper surface of the second structural part. In this case, the edge of the digging hole forms the second closed connection line. Certainly, the upper surface of the second structural part may be slightly lower than the upper surface of the first structural part, and in this case, the edge of the upper surface of the second structural part forms the second closed connection line without affecting an appearance.

In an implementation of the first aspect, the digging hole is a first groove disposed in the upper surface of the first structural part. The second structural part may be a coating disposed within the first groove (for example, formed through spraying). In this case, a depth of the first groove may be, for example, 0.02-0.5 mm.

In an implementation of the first aspect, the digging hole is a through-hole penetrating through the upper surface of the first structural part and the lower surface of the bearing layer. The second structural part may be directly disposed in the through-hole by using an injection molding process or a spraying process, or may be disposed in the through-hole through mounting. This is not specifically limited herein.

In an implementation of the first aspect, a shape of a longitudinal section of the through-hole is trapezoidal or rectangular. A section refers to a plane pattern obtained by using a plane to truncate a geometry. In this case, the through-hole is regarded as a geometry, and the longitudinal section is a plane pattern obtained by using a plane perpendicular to the upper surface of the bearing layer to truncate the through-hole. A longitudinal section of the second structural part and the longitudinal section of the through-hole may be of the same shape, or may be of different shapes. This is not specifically limited herein. A person skilled in the art can understand that the longitudinal section of the second structural part and the longitudinal section of the through-hole may be of the same shape if the second structural part is formed in the through-hole directly by using the injection molding process or the spraying process. If the second structural part is disposed in the through-hole through mounting, the longitudinal section of the second structural part and the longitudinal section of the through-hole may be of the same shape, or may be of different shapes. For example, if the shape of the longitudinal section of the through-hole is trapezoidal, the shape of the longitudinal section of the second structural part may be trapezoidal or rectangular.

In an implementation of the first aspect, both the shape of the longitudinal section of the through-hole and the shape of the longitudinal section of the second structural part are trapezoidal. Compared with a case in which the shape of the longitudinal section of the second structural part is rectangular, a position of the second structural part can be better limited, to prevent the second structural part from falling out of a side of the upper surface of the first structural part.

In an implementation of the first aspect, if the second structural part is disposed in the through-hole through mounting, regardless of whether the shape of the longitudinal section of the second structural part is the same as or different from the shape of the longitudinal section of the through-hole, to fasten the second structural part and the through-hole and prevent the second structural part from falling out of the through-hole, a first adhesive portion is disposed between an outer wall of the second structural part and an inner wall of the through-hole, and the second structural part and the through-hole are connected by using the first adhesive portion.

In an implementation of the first aspect, along a direction gradually away from the lower surface of the bearing layer, the through-hole includes a first hole segment and a second hole segment that are sequentially connected, an orthographic projection that is on the upper surface of the bearing layer and that is of an edge that is of the first hole segment and that is close to the second hole segment is located outside an orthographic projection that is on the upper surface of the bearing layer and that is of an edge that is of the second hole segment and that is close to the first hole segment, a plane portion is formed between the edge that is of the second hole segment and that is close to the first hole segment and the edge that is of the first hole segment and that is close to the second hole segment, and a shape of a longitudinal section of the first hole segment and a shape of a longitudinal section of the second hole segment are trapezoidal or rectangular.

Because the orthographic projection that is on the upper surface of the bearing layer and that is of the edge that is of the first hole segment and that is close to the second hole segment is located outside the orthographic projection that is on the upper surface of the bearing layer and that is of the edge that is of the second hole segment and that is close to the first hole segment, and the plane portion is formed between the edge that is of the second hole segment and that is close to the first hole segment and the edge that is of the first hole segment and that is close to the second hole segment, a hole diameter of the second hole segment is smaller than a hole diameter of the first hole segment as a whole, and a limiting step is formed between the first hole segment and the second hole segment. In addition, because the longitudinal section of the first hole segment and the longitudinal section of the second hole segment are trapezoidal or rectangular, the first hole segment and the second hole segment are gradually shrinking along the direction gradually away from the lower surface of the bearing layer. In this case, the longitudinal section of the second structural part and the longitudinal section of the through-hole may be of the same shape, or may be of different shapes. For example, the second structural part may be manufactured into a stepped shape, that is, the shape of the longitudinal section of the second structural part may be the same as the shape of the longitudinal section of the through-hole. Compared with a case in which the shape of the longitudinal section of the second structural part is rectangular, the second structural part may be prevented from falling out of the side of the upper surface of the first structural part when the second structural part is mounted in the through-hole. In addition, the second structural part is manufactured into the stepped shape, to form a grabbing portion on the second structural part, so as to facilitate grabbing during mounting.

In an implementation of the first aspect, to fasten the second structural part and the through-hole and prevent the second structural part from falling out of the through-hole, a second adhesive portion is disposed between the second structural part and the plane portion, and the second structural part and the through-hole are connected by using the second adhesive portion.

In an implementation of the first aspect, the first hole segment is provided in the bearing layer and the first structural part, the second hole segment is provided in the first structural part, and the edge that is of the first hole segment and that is close to the second hole segment is located in the region enclosed by the first closed connection line. That the edge that is of the first hole segment and that is close to the second hole segment is located in the region enclosed by the first closed connection line means that the orthographic projection that is on the upper surface of the bearing layer and that is of the edge that is of the first hole segment and that is close to the second hole segment and an orthographic projection that is of the first closed connection line and that is on the upper surface of the bearing layer overlap, or the orthographic projection that is on the upper surface of the bearing layer and that is of the edge that is of the first hole segment and that is close to the second hole segment is located in the region enclosed by the first closed connection line, and there is a gap between the orthographic projection that is on the upper surface of the bearing layer and that is of the edge that is of the first hole segment and that is close to the second hole segment and the orthographic projection that is of the first closed connection line and that is on the upper surface of the bearing layer. In this case, a depth of the first hole segment is greater than a thickness of the bearing layer, and the plane portion is disposed on the first structural part, and corresponds to a portion that is of the first structural part and that is from the edge that is of the first hole segment and that is close to the second hole segment to the edge that is of the second hole segment and that is close to the first hole segment.

In an implementation of the first aspect, the first hole segment is provided in the bearing layer, and the edge that is of the first hole segment and that is close to the second hole segment is located in or outside the region enclosed by the first closed connection line. That the edge that is of the first hole segment and that is close to the second hole segment is located in the region enclosed by the first closed connection line means that the orthographic projection that is on the upper surface of the bearing layer and that is of the edge that is of the first hole segment and that is close to the second hole segment and an orthographic projection that is of the first closed connection line and that is on the upper surface of the bearing layer overlap, or the orthographic projection that is on the upper surface of the bearing layer and that is of the edge that is of the first hole segment and that is close to the second hole segment is located in the region enclosed by the first closed connection line, and there is a gap between the orthographic projection that is on the upper surface of the bearing layer and that is of the edge that is of the first hole segment and that is close to the second hole segment and the orthographic projection that is of the first closed connection line and that is on the upper surface of the bearing layer. In this case, there are two possible cases. In the first case, the depth of the first hole segment is less than the thickness of the bearing layer, and the plane portion is disposed on the bearing layer, and corresponds to a portion that is of the bearing layer and that is from the edge that is of the first hole segment and that is close to the second hole segment to the edge that is of the second hole segment and that is close to the first hole segment. In the second case, the depth of the first hole segment is equal to the thickness of the bearing layer, and the plane portion is disposed on the first structural part, and corresponds to a portion that is of the first structural part and that is from the edge that is of the first hole segment and that is close to the second hole segment to the edge that is of the second hole segment and that is close to the first hole segment.

That the edge that is of the first hole segment and that is close to the second hole segment is located outside the region enclosed by the first closed connection line means that the orthographic projection that is on the upper surface of the bearing layer and that is of the edge that is of the first hole segment and that is close to the second hole segment is located outside the region enclosed by the first closed connection line, and there is a gap between the orthographic projection that is on the upper surface of the bearing layer and that is of the edge that is of the first hole segment and that is close to the second hole segment and the orthographic projection that is of the first closed connection line and that is on the upper surface of the bearing layer. If the edge that is of the first hole segment and that is close to the second hole segment is located outside the region enclosed by the first closed connection line, compared with a case in which the edge that is of the first hole segment and that is close to the second hole segment is located in the region enclosed by the first closed connection line, an area of a portion that is of the second structural part and that is located in the first hole segment may be increased, to increase a grabbing area and improve efficiency of mounting the second structural part in the through-hole.

In an implementation of the first aspect, there are a plurality of second structural parts. The plurality of second structural parts each are disposed independently. Alternatively, portions that are of the plurality of second structural parts and that are located in the first hole segments are connected as an integral structure. If the plurality of second structural parts each are disposed independently, a longitudinal section of each through-hole may be trapezoidal or rectangular; or each through-hole may include, along the direction gradually away from the lower surface of the bearing layer, the first hole segment and the second hole segment that are sequentially connected. If each through-hole includes, along the direction gradually away from the lower surface of the bearing layer, the first hole segment and the second hole segment that are sequentially connected, depths of the first hole segments of all through-holes may be the same or different, and depths of the second hole segments may also be the same or different.

If portions that are of the plurality of second structural parts and that are located in the first hole segments are connected as an integral structure, the first hole segments of all through-holes are connected to each other. In this case, the depths of the first hole segments of all through-holes may also be the same or different, where portions that are of the plurality of second structural parts, that are located in the first hole segment and that are connected to each other each may be referred to as a connection edge, the connection edge may be disposed, for example, between two adjacent second structural parts, and the two second structural parts are connected as an integral structure by using connection edges thereof.

For example, a LOGO logo is letters "NOHOR", and if the plurality of second structural parts each are disposed independently, a longitudinal section of a through-hole in the letter "O" may be tapered or truncated cone shaped, a longitudinal section of a through-hole in the letter "R" may also be tapered or truncated cone shaped, and a second structural part in the letter "O" and a second structural part in the letter "R" each are independent of each other. If the portions that are of the plurality of second structural parts and that are located in the first hole segments are connected as an integral structure, through-holes in the two letters "O" and the through-hole in the letter "R" each include a first hole segment and a second hole segment, and the first hole segment in the two letters "O" and the first hole segment in the letter "R" each are located outside a region thereof enclosed by the first closed connection line, and are connected as an integral structure. For example, in the letters "NOHOR", a position that is of the letter "H" in a middle of the two letters "O" and that is corresponding to the hole segment is also hollowed out, so that the edges that are of the two letters "O" and that are close to each other are opened up, and edges that are of "R" and are of "O" that is close to "R" and that are close to each other are opened up, to enable portions that are of the second structural parts in the two letters "O" and that are located in the first hole segments to cross the letter "H" and to be connected to a portion that is of the second structural part in the letter "R" and that is located in the first hole segment as an integral structure. Positions that are of the bearing layer and that are corresponding to the two letters "O", the letter "H", and the letter "R" each may be hollowed out.

In an implementation of the first aspect, a lower surface of the second structural part is flush with the lower surface of the bearing layer.

In an implementation of the first aspect, the decoration part further includes a base, the base is disposed on a side of the lower surface of the bearing layer, and the base is connected to the at least one second structural part; and an edge of the base extends beyond an orthographic projection that is of each second structural part and that is on the upper surface of the bearing layer, a third adhesive portion is disposed between the base and the bearing layer, and the base and the bearing layer are connected by using the third adhesive portion.

In an implementation of the first aspect, the upper surface of the second structural part is flush with the upper surface of the first structural part.

In an implementation of the first aspect, the thickness of the bearing layer is 0.1-0.3 mm.

According to a second aspect, a housing of an electronic device is provided. The housing includes: a base layer, a decoration part, and a decoration layer, where an outer surface of the base layer includes a first region and a second region, and the first region and the second region are adjacent to each other; the decoration part is disposed on the outer surface of the base layer and located in the first region, where the decoration part is connected to the base layer by using a bearing layer; and the decoration layer includes a portion covering the second region and a portion covering the first region except a region enclosed by a first closed connection line. That is, the decoration layer covers the second region and a region that is of the first region and that is not covered by a first structural part and a second structural part. The second region may be a region on the outer surface of the base layer except the first region; that is, the decoration layer covers all regions that are of the base layer and that are not covered by the first structural part and the second structural part.

If the decoration part further includes a third structural part, the decorating layer includes a portion covering the second region and a portion covering the first region except a region enclosed by the first closed connection line and a third closed connection line. In this case, if the second region is the region on the outer surface of the base layer except the first region, the decoration layer covers all regions that are of the base layer and that are not covered by the first structural part, the second structural part, and the third structural part.

In comparison with a related technology in which the decoration part is sheet-shaped and includes the bearing layer, and a LOGO pattern formed on a surface of the bearing layer by using a printing or laser process, and the LOGO pattern is a plane pattern, the first structural part, the second structural part, and the third structural part in the decoration part have specific thicknesses, so that an overall thickness of the decoration part may be increased, thereby improving firmness of combination between the decoration part and the base layer and avoiding falling. In addition, in comparison with the related technology in which the decoration part is adhered to the decoration layer by using adhesive (such as hot melt adhesive), in addition to being adhered to the base layer by using the adhesive, the decoration part may be covered by the decoration layer, so that the firmness of connection between the decoration part and the base layer may be further improved. Further, because the decoration layer covers the second region and a region that is of the first region and that is not covered by the first structural part, the second structural part, and the third structural part, the decoration layer may continuously cover at a transition position of the base layer and the bearing layer, so as to avoid forming a gap at the transition position of the base layer and the bearing layer of the decoration part. Further, the first decoration layer covers the region that is of the first region and that is not covered by the first structural part, the second structural part and the third structural part, to make transition between the first decoration layer and each of the first structural part and the third structural part more natural, so as to better highlight an appearance profile of the LOGO pattern and make the LOGO display more conspicuous, thereby further improving an appearance.

The foregoing describes a solution in which the decoration part is directly fastened to the outer surface of the base layer. In this solution, a thickness of the base layer does not change. A difference is that if a portion that is of the second structural part and that is located in a first hole segment is manufactured into a base-like structure, and the portion is located on a same layer as the bearing layer, an overall thickness of the decoration part may be reduced in comparison with manufacturing the foregoing base-like structure on a side of the lower surface of the bearing layer, so that an overall thickness of the housing can be minimized. In addition, because the thickness of the base layer does not change, the solution is also suitable for manufacturing an ultra-thin base layer.

In an implementation of the second aspect, a position that is of the outer surface of the base layer and that is corresponding to the first region is provided with a second groove, and the bearing layer is disposed in the second groove. Because the thickness of the base layer may be reduced by disposing the second groove in the base layer, the solution is not suitable for manufacturing a product with an ultra-thin base layer. In addition, the portion that is of the second structural part and that is located in the first hole segment is manufactured into a base-like structure, and the portion is located on the same layer as the bearing layer, a depth of the second groove may be reduced in comparison with manufacturing the foregoing base-like structure on the side of the lower surface of the bearing layer, to avoid digging through the base layer.

In an implementation of the second aspect, an edge of an upper surface of the bearing layer is provided with a chamfer, so that the transition of a segment gap between the bearing layer and the base layer is smoother, to improve adhesion strength of the decoration layer on the base layer and the bearing layer without forming the segment gap mark on an outer surface of the first decoration layer.

In an implementation of the second aspect, a position that is of the base layer and that is corresponding to the second groove has a protrusion towards a side that is away from the bearing layer. That is, the position that is of the base layer and that is corresponding to the second groove is thickened, to ensure that a thickened base layer has a specific thickness after the groove is cut, thereby ensuring strength of the base layer.

In an implementation of the second aspect, a height of the protrusion is 0.05-0.2 mm.

In an implementation of the second aspect, the base layer is an aramid fiber composite board, a glass fiber composite board, or a carbon fiber composite board, which can improve the strength of the base layer.

In an implementation of the second aspect, the decoration layer is made of vegan leather, animal dermis, plant bark, or silica gel. The vegan leather is a soft material with a leather feel and appearance, is soft, durable, waterproof, and is a kind of artificial leather. The vegan leather is warm, skin-friendly, anti-fingerprint, anti-falling, and the like. The dermis is obtained by processing an animal skin, is breathable and skin-friendly, and is relatively expensive. The plant bark is also referred to as microfiber leather, and its full name is "microfiber reinforced leather". It has extremely excellent wear resistance, excellent air permeability, and aging resistance, is soft and comfortable, has strong flexibility, and has the currently advocated environmental protection effect.

Certainly, the foregoing is merely an example, and the base layer may alternatively be a plastic board, a metal board, or the like. This is not specifically limited herein.

According to a third aspect, an electronic device is provided. The electronic device includes the housing according to the second aspect, a display screen, and the like. The housing may be a rear cover of the electronic device. The electronic device has a same technical effect as the housing of the electronic device according to the second aspect. Details are not described herein again.

BRIEF DESCRIPTION OF THE DRAWINGS

To describe the technical solutions in embodiments of this application or in the conventional technology more clearly, the following briefly describes accompanying drawings required for describing embodiments or the conventional technology. Apparently, the accompanying drawings in the following descriptions only show some embodiments of the present invention, and a person of ordinary skill in the art may still derive other drawings from these accompanying drawings without creative efforts.

FIG. 5A is a perspective view of a decoration part according to an embodiment of this application;

FIG. 5B is a top view of another decoration part according to an embodiment of this application;

FIG. 5C is a sectional view in a direction C-C' in FIG. 5B according to an embodiment of this application;

FIG. 5D is another sectional view in a direction C-C' in FIG. 5B according to an embodiment of this application;

DETAILED DESCRIPTION OF ILLUSTRATIVE EMBODIMENTS

Figure 1:
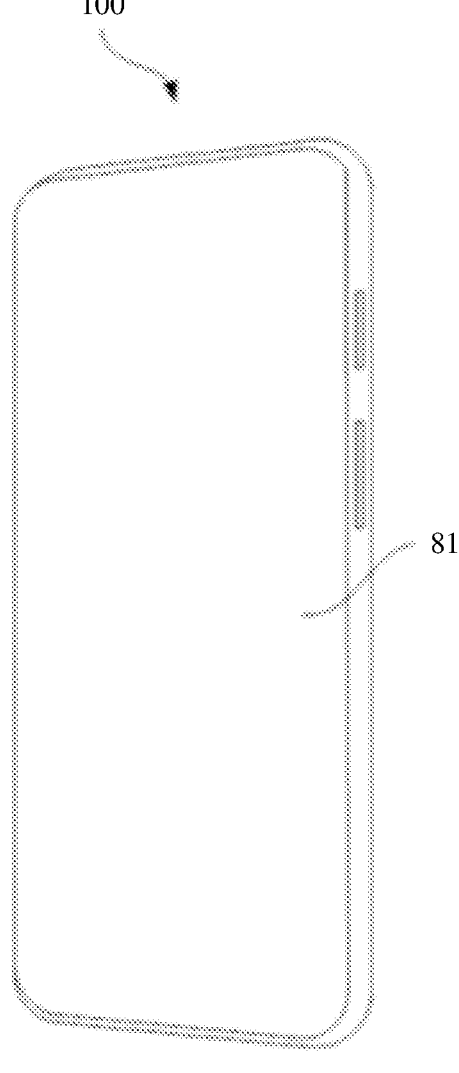
FIG. 1 is a diagram of an overall structure of an electronic device according to an embodiment of this application.

The following clearly describes technical solutions in embodiments of this application with reference to accompanying drawings. Apparently, the described embodiments are some rather than all of embodiments of this application. All other embodiments obtained by a person of ordinary skill in the art based on embodiments of this application shall fall within the protection scope of this application.

Unless the context requires otherwise, the term "comprise (comprise)" and other forms thereof such as the third-person singular form "comprises (comprises)" and the present participle form "comprising (comprising)" throughout the specification and claims are construed as an open and inclusive meaning, namely, "including, but not limited to". In descriptions of the specification, the terms such as "one embodiment (one embodiment)", "some embodiments (some embodiments)", "exemplary embodiments (exemplary embodiments)", "example (example)", "specific example (specific example)", or "some examples (some examples)" are intended to indicate that specific features, structures, materials or characteristics related to the embodiment or example are included in at least one embodiment or example of this application. Schematic representations of the above terms do not necessarily refer to a same embodiment or example. In addition, the specific features, structures, materials or features may be included in any one or more embodiments or examples in any suitable manner.

In the following, the terms "first" and "second" are used for descriptive purposes only, and cannot be construed as indicating or implying relative importance or implicitly indicating the quantity of technical features indicated. Therefore, the features defined with "first" and "second" may explicitly or implicitly include one or more of the features. In the descriptions of embodiments of this application, unless otherwise specified, "a plurality of" means two or more.

The phrase "at least one of A, B and C" has a same meaning as the phrase "at least one of A, B or C", and they both include the following combinations of A, B, and C: only A, only B, only C, a combination of A and B, a combination of A and C, a combination of B and C, and a combination of A, B, and C.

The phrase "A and/or B" includes the following three combinations: only A, only B, and a combination of A and B.

In addition, the use of the phrase "based on" is meant to be open and inclusive, because a process, step, calculation or other action that is "based on" one or more of the stated conditions or values may, in practice, be based on additional conditions or values exceeding those stated.

The term "about", "substantially", or "approximately" as used herein includes a stated value and an average value within an acceptable range of deviation of a particular value, and the acceptable range of deviation is determined by a person of ordinary skill in the art while considering measurement in question and errors associated with measurement of a particular quantity (that is, limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shape with respect to the accompanying drawings due to, for example, manufacturing technologies and/or tolerances may be envisaged. Therefore, the exemplary embodiments should not be construed to be limited to the shapes of the regions shown herein, but to include deviations in shape due to, for example, manufacturing. For example, an etched region shown in a rectangular shape usually has a feature of being curved. Therefore, the regions shown in the accompanying drawings are schematic in nature, and their shapes are not intended to show actual shapes of the regions in a device, and are not intended to limit the scope of the exemplary embodiments.

In the descriptions of this application, it should be understood that the orientation or positional relationship indicated by the terms "center", "upper", "lower", "front", "rear", "left", "right", "vertical", "horizontal", "top", "bottom", "inner", "outer", and the like, is based on the orientation or positional relationship shown in the accompanying drawings, and is only for ease of describing this application and simplifying the description, rather than indicating or implying that the apparatus or component referred to must have a specific orientation, be constructed and operated in a specific orientation, which therefore cannot be understood as a limitation to this application. In the descriptions of this application, unless otherwise specified, "a plurality of" means two or more.

Some embodiments of this application provide an electronic device, including but not limited to a mobile or fixed terminal such as a mobile phone, a tablet personal computer, a notebook computer, an ultra-mobile personal computer (ultra-mobile personal computer, UMPC), a handheld computer, a walkie-talkie, a netbook, a POS terminal, a personal digital assistant (personal digital assistant, PDA), an event data recorder, a wearable device, or a virtual reality device.

Figure 2:
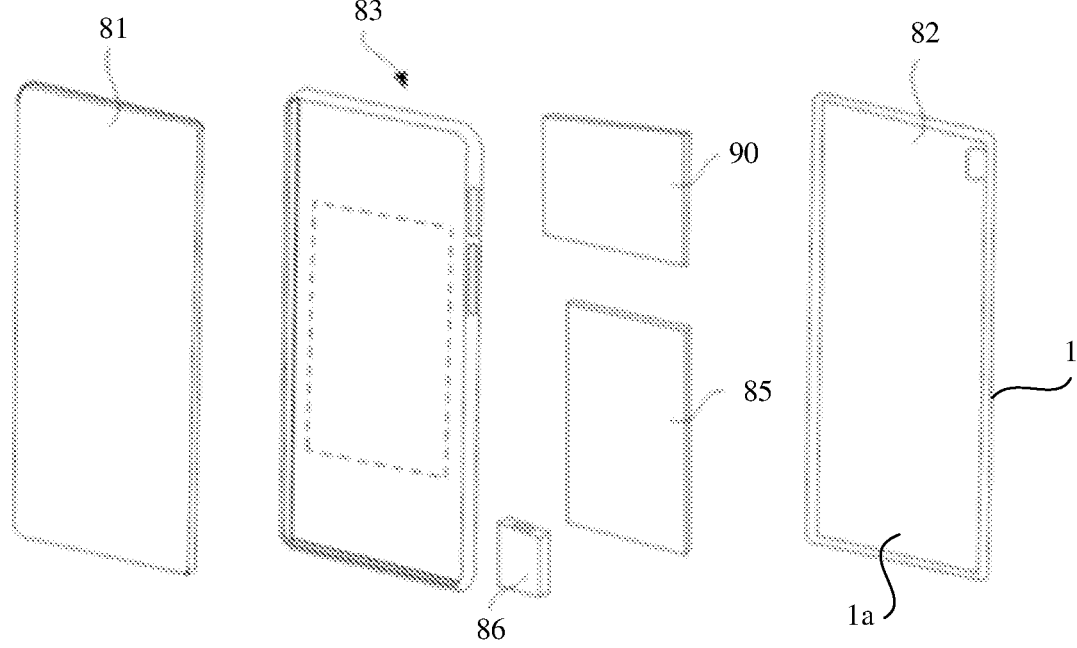
FIG. 2 is an exploded view of an electronic device according to an embodiment of this application.
Figure 3A:
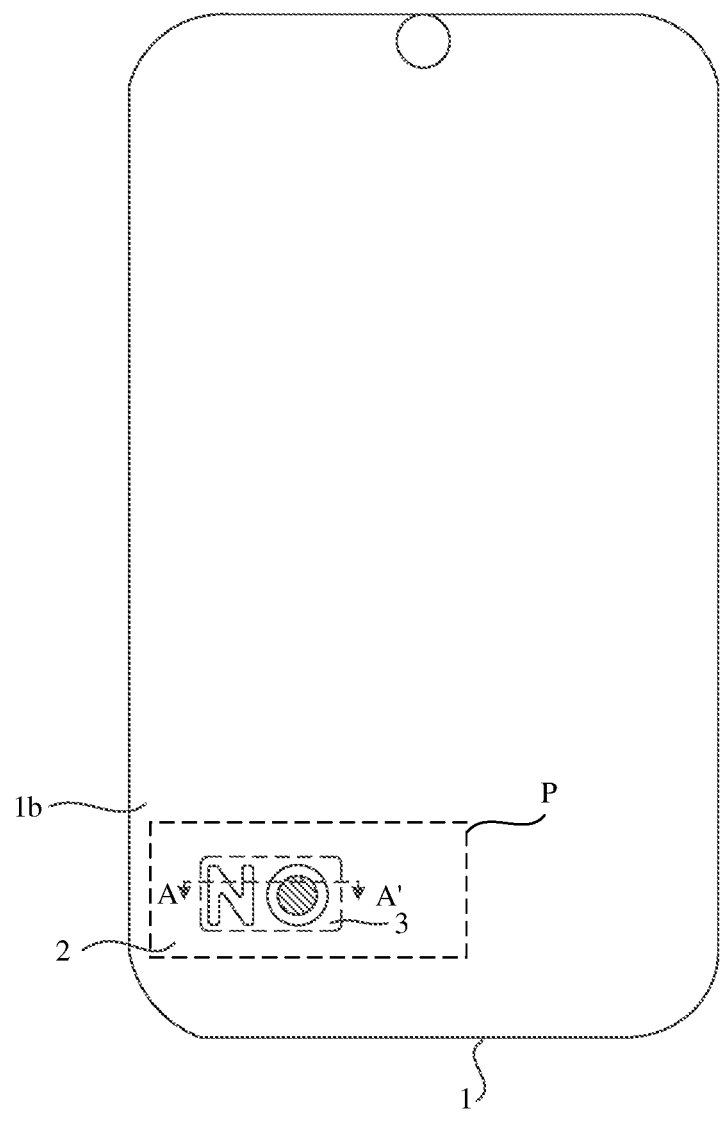
FIG. 3A is a top view of a housing of an electronic device according to an embodiment of this application.
Figure 3B:
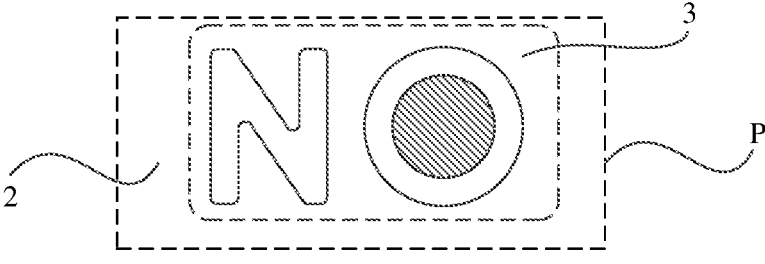
FIG. 3B is an enlarged view of a region P in FIG. 3A according to an embodiment of this application.
Figure 3C:
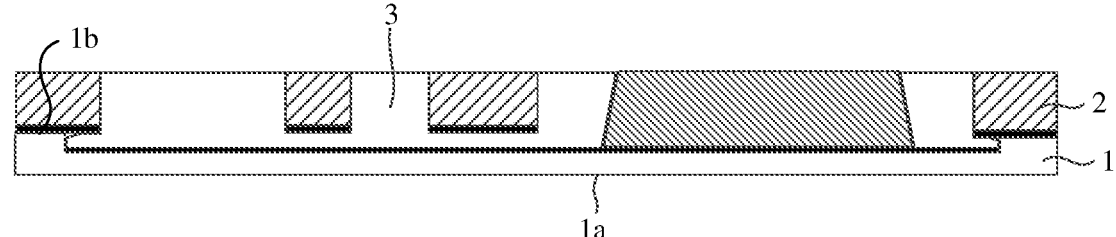
FIG. 3C is a sectional view in a direction A-A' in FIG. 3A according to an embodiment of this application.

Using the mobile phone as an example, as shown in FIG. 1 and FIG. 2, the mobile phone 100 may include a display screen 81 and a rear cover 82; and a middle frame 83, a circuit board assembly 90, a battery 85, and a sound producing component 86 may be disposed between the display screen 81 and the rear cover 82. The circuit board assembly 90, the battery 85, and the sound producing component 86 may be disposed on the middle frame 83. For example, the circuit board assembly 90, the battery 85, and the sound producing component 86 are disposed on a surface that is of the middle frame 83 and that faces the rear cover 82, so that the circuit board assembly 90 is located in a cavity enclosed by the rear cover 82 and the middle frame 83. Alternatively, the circuit board assembly 90, the battery 85, and the sound producing component 86 may be disposed on a surface that is of the middle frame 83 and that faces the display screen 81, so that the circuit board assembly 90 is located in a cavity enclosed by the display screen 81 and the middle frame 83.

In some embodiments of this application, when the battery 85 is disposed on the middle frame 83, for example, a battery compartment may be disposed on the surface that is of the middle frame 83 and that faces the rear cover 82, and the battery 85 is mounted in the battery compartment (as shown by a dashed-line box in FIG. 2) on the middle frame 83. In this embodiment of this application, the battery 85 may be connected to a charging management module and the circuit board assembly 90 by using a power management module. The power management module receives an input of the battery 85 and/or an input of the charging management module, and supplies power to a processor, an internal memory, an external memory, the display screen 81, a camera, a communication module, and the like. The power management module may be further configured to monitor parameters such as a battery capacity, a quantity of battery cycles, and a battery health status (leakage or impedance). In some other embodiments, the power management module may alternatively be disposed in a processor of the circuit board assembly 90. In some other embodiments, the power management module and the charging management module may alternatively be disposed in a same device.

To implement a loudspeaker function of the mobile phone 100, as shown in FIG. 2, the mobile phone 100 may further include the sound producing component 86. The sound producing component 86 may convert an audio electrical signal into a sound signal. The mobile phone 100 may play music or implement hands-free calling by using the sound producing component 86. The sound producing component 86 may be disposed on the surface that is of the middle frame 83 and that faces the rear cover 82, so that sound producing component 86 is formed in the cavity enclosed by the rear cover 82 and the middle frame 83.

In some embodiments of this application, a microphone, namely, a mike, is further disposed in the mobile phone 100. The microphone is configured to convert a sound signal into an electrical signal. When making a call or sending a voice message, a user can make the user's mouth approach the microphone and emit a sound, to input a sound signal to the microphone.

In this embodiment of this application, the display screen 81 may be an organic light-emitting diode (Organic Light- Emitting Diode, OLED) display screen, or may be a liquid crystal display (Liquid Crystal Display, LCD) screen. It should be understood that the display screen 81 may include a display and a touch component. The display is configured to output display content to the user, and the touch component is configured to receive a touch event entered by the user on the display screen 81.

It may be understood that the structures illustrated in the embodiments of this application do not constitute a specific limitation on the mobile phone 100. In some other embodiments of this application, the mobile phone 100 may include more or fewer components than those shown in the figure, or combine some components, or split some components, or have different component arrangements. For example, the mobile phone 100 may further include components such as a flash.

Some embodiments of this application provide a housing of an electronic device, and the housing may be, for example, the foregoing rear cover. As shown in FIG. 2, FIG. 3A, FIG. 3B, and FIG. 3C, the housing includes: a base layer 1, a first decoration layer 2, and a decoration part 3. The base layer 1 may include an inner surface 1*a* and an outer surface 1*b*, where the inner surface 1*a* is a surface that is of the base layer 1 and that faces a display screen 81, and the outer surface 1*b* is a surface that is of the base layer 1 and that is away from the display screen 81. Both the first decoration layer 2 and the decoration part 3 are disposed on the outer surface 1*b* of the base layer 1. For example, the first decoration layer 2 may be made of vegan leather, animal dermis, plant bark, or silica gel, and the decoration part 3 may be a LOGO logo. The vegan leather is a soft material with a leather feel and appearance, is soft, durable, waterproof, and is a kind of artificial leather. The vegan leather is warm, skin-friendly, anti-fingerprint, anti-falling, and the like. The dermis is obtained by processing an animal skin, is breathable and skin-friendly, and is relatively expensive. The plant bark is also referred to as microfiber leather, and its full name is "microfiber reinforced leather". It has extremely excellent wear resistance, excellent air permeability, and aging resistance, is soft and comfortable, has strong flexibility, and has the currently advocated environmental protection effect.

Figure 4A:
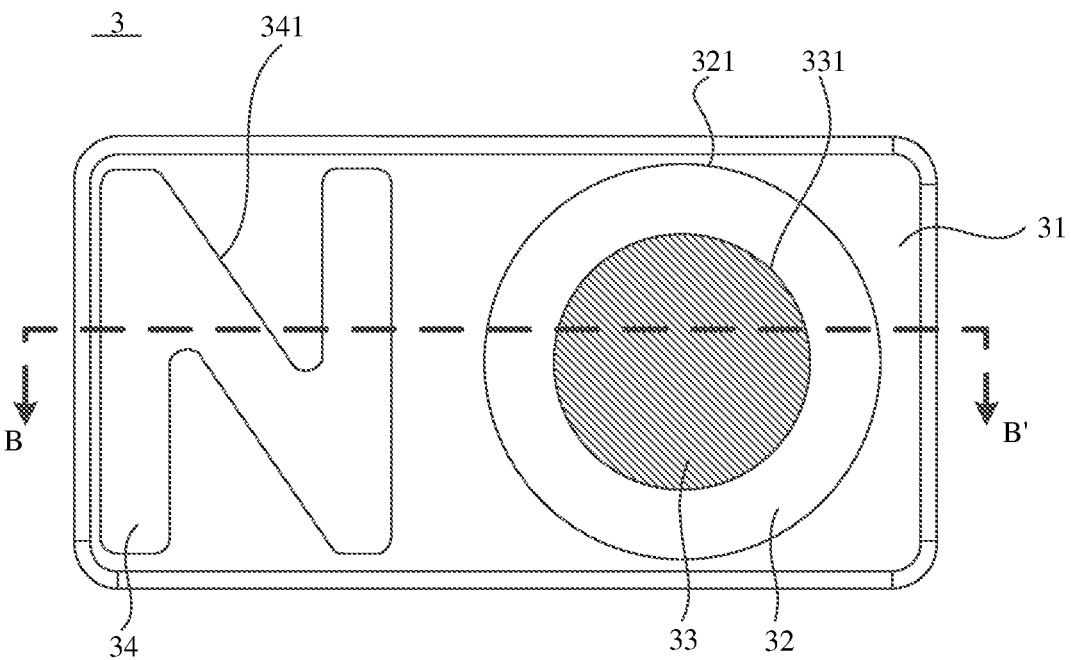
FIG. 4A is a top view of a decoration part according to an embodiment of this application.
Figure 4B:
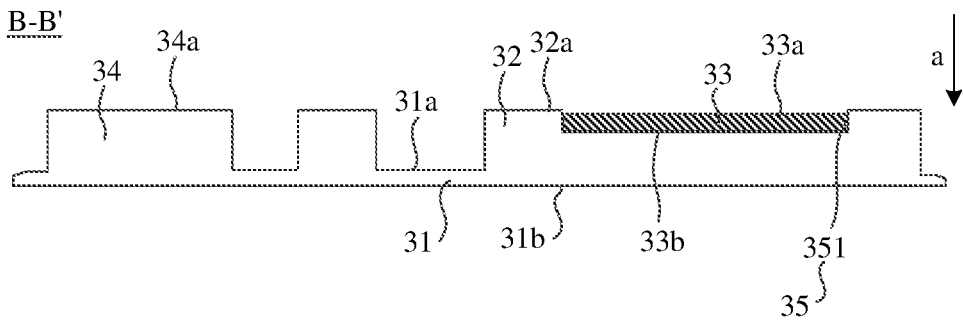
FIG. 4B is a sectional view in a direction B-B' in FIG. 4A according to an embodiment of this application.

As shown in FIGS. 4A and 4B, in some embodiments, a decoration part 3 includes: a bearing layer 31, at least one first structural part 32, and at least one second structural part 33. The bearing layer 31 includes an upper surface 31*a* and a lower surface 31*b*. The at least one first structural part 32 is disposed on the upper surface 31*a* of the bearing layer 31, and an edge of an upper surface 32*a* of one first structural part 32 forms a first closed connection line 321, and the upper surface 32*a* of the first structural part 32 is a surface that is of the first structural part 32 and that is away from the bearing layer 31. Each second structural part 33 is disposed on the upper surface 32*a* of the first structural part 32 and located in a region enclosed by the first closed connection line 321; along a direction that is directed from the upper surface 31*a* to the lower surface 31*b* of the bearing layer 31 (as a direction indicated by arrows a in FIG. 4B and FIG. 4C), the second structural part 33 includes an upper surface 33*a* and a lower surface 33*b* that are arranged successively, an edge of the upper surface 33*a* of the second structural part 33 forms a second closed connection line 331; and the first closed connection line 321 and the second closed connection line 331 do not overlap at least in part.

Because the edge of the upper surface 32*a* of the first structural part 32 forms the first closed connection line 321, the edge of the upper surface 33*a* of the second structural part 33 forms the second closed connection line 331, and the second structural part 33 is located in the region enclosed by the first closed connection line 321, the first structural part 32 and the at least one second structural part 33 may be regarded as a pattern part, and a pattern represented by the pattern part may be a letter, a Chinese character, a numeral, or another pattern.

In some embodiments, for example, the pattern represented by the pattern part is a letter "O". The pattern part may include the first closed connection line 321 and one second closed connection line 331 disposed within the first closed connection line 321, the first closed connection line 321 corresponds to an outer ring of the letter "O", and the second closed connection line 331 corresponds to an inner ring of the letter "O".

In some other embodiments, for example, the pattern represented by the pattern part is a letter "B". The pattern part may include the first closed connection line 321 and two second closed connection lines 331 disposed within the first closed connection line 321, the first closed connection line 321 corresponds to an outer ring of the letter "B", and the two second closed connection lines 331 respectively correspond to two inner rings of the letter "B".

Figure 4C:
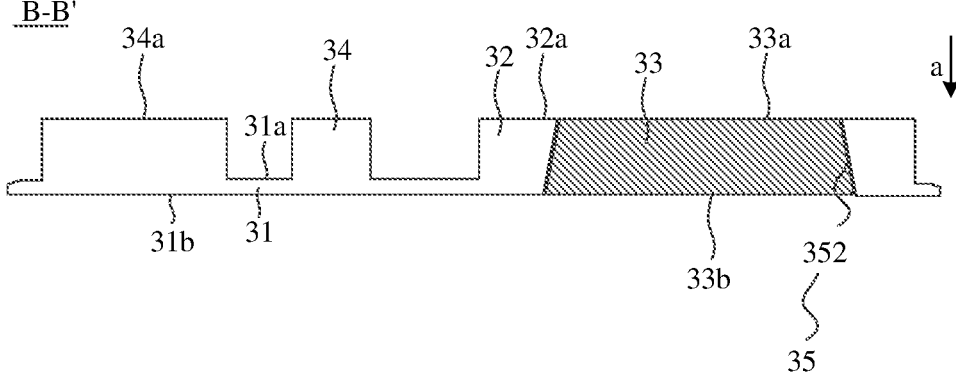
FIG. 4C is another sectional view in a direction B-B' in FIG. 4A according to an embodiment of this application.

In some embodiments, as shown in FIG. 4A, FIG. 4B, and FIG. 4C, the decoration part 3 further includes at least one third structural part 34 disposed on the upper surface 31*a* of the bearing layer 31. An edge of an upper surface 34*a* of one third structural part 34 forms a third closed connection line 341, and the upper surface 34*a* of the third structural part 34 is a surface that is of the third structural part 34 and that is away from the bearing layer 31.

In these embodiments, different from the pattern part, a pattern represented by the third structural part 34 includes only one closed connection line. For example, the third structural part 34 may be a pattern part of a letter "N".

In this way, any pattern including the first closed connection line 321 and at least one second closed connection line 331 disposed within the first closed connection line 321 may be regarded as a first pattern. For example, letters "O", "A", "B", "D", "P", "Q", and "R" are all first patterns. Any pattern including the third closed connection line 341 may be regarded as a second pattern. For example, letters "N", "C", "F", "L", and "H" are all second patterns.

The foregoing shows only a case in which the first pattern and the second pattern are letters, and a person skilled in the art can understand that all patterns other than letters also fall within the protection scope of this application, for example, the first pattern and the second pattern may also be Chinese characters or other patterns.

In addition, it should be noted that the foregoing shows only a case in which the first closed connection line 321 and the second closed connection line 331 do not overlap at all, and a person skilled in the art can understand that the first closed connection line 321 and the second closed connection line 331 may alternatively partially overlap. As shown in FIG. 4A, the second closed connection line 331 in the letter "O" moves upward, to partially overlap the first closed connection line 321, that is, the outer ring is tangent to the inner ring. A pattern formed in this way is applicable herein.

Still referring to FIG. 4A, FIG. 4B, and FIG. 4C, in some embodiments, the first structural part 32 and the third structural part 34 each may be, for example, plastic parts formed through injection molding; and in some embodiments, the first structural part 32, the third structural part 34, and the bearing layer 31 are of an integral structure. The upper surface 32*a* of the first structural part 32 and the upper surface 34*a* of the third structural part 34 are higher than the upper surface 31*a* of the bearing layer 31.

In some embodiments, the second structural part 33 may be a second decoration layer that is disposed on the upper surface 32*a* of the first structural part 32 and that is located in the region enclosed by the first closed connection line 321.

In these embodiments, the second decoration layer may be formed by using a process such as laser (laser etching), electroplating, PVD coating, printing, or thin film attaching (for example, the thin film may be made of vegan leather, animal dermis, plant bark, or silica gel). If a thickness of the second decoration layer is very thin and can be ignored, an edge of an upper surface of the second decoration layer is flush with an edge of a lower surface, that is, the edge of the upper surface 33*a* of the second structural part 33 may be regarded as an edge of the second decoration layer, and in this case, the edge of the second decoration layer forms the second closed connection line 331.

In some other embodiments, as shown in FIG. 4B and FIG. 4C, a digging hole 35 is provided in the upper surface 32*a* of the first structural part 32 and located in the region enclosed by the first closed connection line 321, and second structural part 33 is disposed in the digging hole 35.

In these embodiments, the digging hole 35 is formed in the upper surface 32*a* of the first structural part 32, and the second structural part 33 is disposed in the digging hole 35. Therefore, if the upper surface 33*a* of the second structural part 33 protrudes out of the digging hole 35, an edge that is of the digging hole 35 and that is on the upper surface 32*a* of the first structural part 32 may not overlap the edge of the upper surface of the second structural part 33; or if the upper surface 33*a* of the second structural part 33 is flush with the upper surface 32*a* of the first structural part 32, the edge that is of the digging hole 35 and that is on the upper surface 32*a* of the first structural part 32 may be regarded as the edge of the upper surface 33*a* of the second structural part 33. In this case, the edge of the digging hole 35 forms the second closed connection line 331. Certainly, the upper surface 33*a* of the second structural part 33 may be slightly lower than the upper surface 32*a* of the first structural part 32, and in this case, the edge of the upper surface 33*a* of the second structural part 33 forms the second closed connection line 331 without affecting an appearance.

In some embodiments, as shown in FIG. 4B, the digging hole 35 is a first groove 351 disposed in the upper surface 32*a* of the first structural part 32. In these embodiments, the second structural part 33 may be a coating disposed within the first groove 351 (for example, formed through spraying). In this case, a depth of the first groove 351 may be, for example, 0.02-0.5 mm.

In some other embodiments, as shown in FIG. 4C, the digging hole 35 is a through-hole 352 penetrating through the upper surface 32*a* of the first structural part 32 and the lower surface 31*b* of the bearing layer 31. In these embodiments, the second structural part 33 may be formed in the through-hole 352 directly by using an injection molding process or a spraying process, or may be disposed in the through-hole 352 through mounting. This is not specifically limited herein.

In some embodiments, as shown in FIG. 4C, a longitudinal section of the through-hole 352 is trapezoidal or rectangular. A section refers to a plane pattern obtained by using a plane to truncate a geometry. In this case, the through-hole 352 is regarded as a geometry, and the longitudinal section is a plane pattern obtained by using a plane perpendicular to the upper surface 31*a* of the bearing layer 31 to truncate the through-hole 352.

In these embodiments, a longitudinal section of the second structural part 33 and the longitudinal section of the through-hole 352 may be of the same shape, or may be of different shapes. This is not specifically limited herein. A person skilled in the art can understand that the longitudinal section of the second structural part 33 and the longitudinal section of the through-hole 352 may be of the same shape if the second structural part 33 is formed in the through-hole 352 directly by using an injection molding process or a spraying process. If the second structural part 33 is disposed in the through-hole 352 through mounting, the longitudinal section of the second structural part 33 and the longitudinal section of the through-hole 352 may be of the same shape, or may be of different shapes. For example, if the shape of the longitudinal section of the through-hole 352 is trapezoidal, the shape of the longitudinal section of the second structural part 33 may be trapezoidal or rectangular.

In some embodiments, the shape of the longitudinal section of the through-hole 352 and the shape of the longitudinal section of the second structural part 33 each are trapezoidal. Compared with a case in which the shape of the longitudinal section of the second structural part 33 is rectangular, a position of the second structural part 33 can be better limited, to prevent the second structural part 33 from falling out of a side of the upper surface 32*a* of the first structural part 32.

Figure 4D:
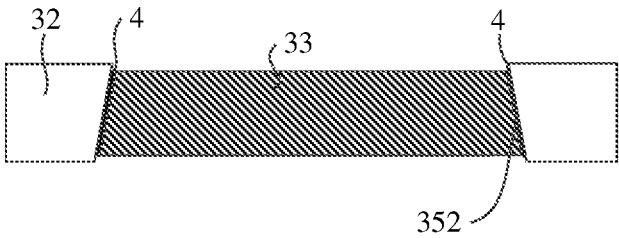
FIG. 4D is a structural diagram in which a first adhesive portion is disposed between a through-hole and a second structural part in FIG. 4C according to an embodiment of this application.

In some embodiments, as shown in FIG. 4D, if the second structural part 33 is disposed in the through-hole 352 through mounting, regardless of whether the shape of the longitudinal section of the second structural part 33 is the same as or different from the shape of the longitudinal section of the through-hole 352, to fasten the second structural part 33 and the through-hole 352 and prevent the second structural part 33 from falling out of the through-hole 352, a first adhesive portion 4 is disposed between an outer wall of the second structural part 33 and an inner wall of the through-hole 352, and the second structural part 33 and the through-hole 352 are connected by using the first adhesive portion 4.

The first adhesive portion 4 may be hot melt adhesive.

Figure 4E:
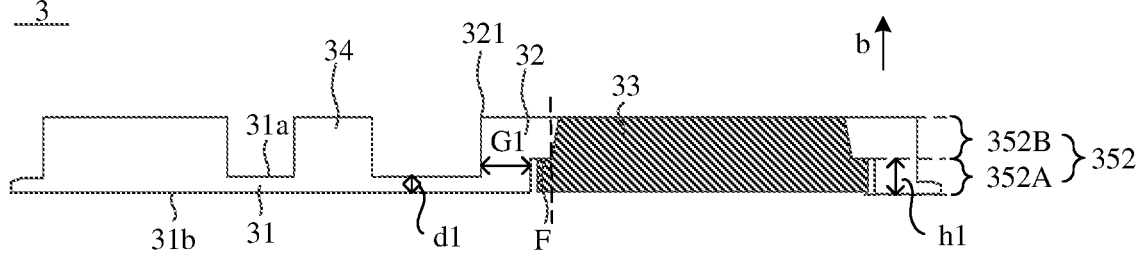
FIG. 4E is another sectional view in a direction B-B' in FIG. 4A according to an embodiment of this application.

In some other embodiments, as shown in FIG. 4E, along a direction gradually away from the lower surface 31*b* of the bearing layer 31 (as a direction indicated by an arrow b in FIG. 4E), the through-digging hole 352 includes a first hole segment 352A and a second hole segment 352B that are sequentially connected, an orthographic projection that is on the upper surface 31*a* of the bearing layer 31 and that is of an edge that is of the first hole segment 352A and that is close to the second hole segment 352B is located outside an orthographic projection that is on the upper surface 31*a* of the bearing layer 31 and that is of an edge that is of the second hole segment 352B and that is close to the first hole segment 352A, a plane portion F is formed between the edge that is of the second hole segment 352B and that is close to the first hole segment 352A and the edge that is of the first hole segment 352A and that is close to the second hole segment 352B, and a shape of a longitudinal section of the first hole segment 352A and a shape of a longitudinal section of the second hole segment 352B are trapezoidal or rectangular.

In these embodiments, because the orthographic projection that is on the upper surface 31*a* of the bearing layer 31 and that is of the edge that is of the first hole segment 352A and that is close to the second hole segment 352B is located outside the orthographic projection that is on the upper surface 31a of the bearing layer 31 and that is of the edge that is of the second hole segment 352B and that is close to the first hole segment 352A, and the plane portion F is formed between the edge that is of the second hole segment 352B and that is close to the first hole segment 352A and the edge that is of the first hole segment 352A and that is close to the second hole segment 352B, a hole diameter of the second hole segment 352B is smaller than a hole diameter of the first hole segment 352A as a whole, and a limiting step is formed between the first hole segment 352A and the second hole segment 352B. In addition, because the shape of the longitudinal section of the first hole segment 352A and the shape of the longitudinal section of the second hole segment 352B are trapezoidal or rectangular, the first hole segment 352A and the second hole segment 352B are gradually shrinking along a direction gradually away from the lower surface 31a of the bearing layer 31. In this case, the longitudinal section of the second structural part 33 and the longitudinal section of the through-hole 352 may be of the same shape, or may be of different shapes. For example, the second structural part 33 may be manufactured into a stepped shape, that is, the shape of the longitudinal section of the second structural part 33 may be the same as the shape of the longitudinal section of the through-hole 352. Compared with a case in which the shape of the longitudinal section of the second structural part 33 is rectangular, the second structural part 33 may be prevented from falling out of the side of the upper surface 32a of the first structural part 32 when the second structural part 33 is mounted in the through-hole 352. In addition, the second structural part 33 is manufactured into the stepped shape, to form a grabbing portion on the second structural part 33, so as to facilitate grabbing during mounting.

Figure 4F:
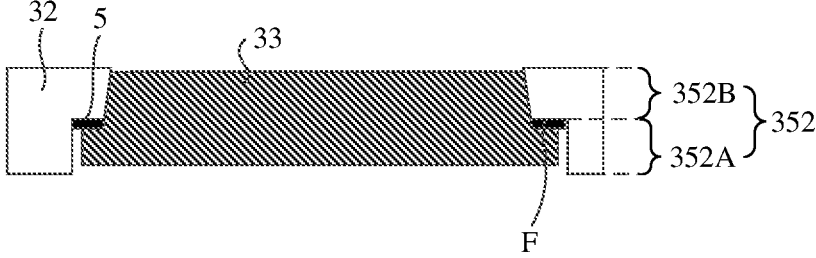
FIG. 4F is a structural diagram in which a second adhesive portion is disposed between a plane portion and a second structural part in FIG. 4E according to an embodiment of this application.

In addition, in this case, to fasten the second structural part 33 and the through-hole 352, and prevent the second structural part 33 from falling out of the through-hole 352. In some embodiments, as shown in FIG. 4F, a second adhesive portion 5 is disposed between the second structural part 33 and the plane portion F, and the second structural part 33 and the through-hole 352 are connected by using the second adhesive portion 5.

For example, the second adhesive portion 5 may also be hot melt adhesive.

It should be noted that the first hole segment 352A and the second hole segment 352B are sequentially disposed along the direction gradually away from the lower surface 31b of the bearing layer 31, and therefore, the first hole segment 352A may be disposed only in the bearing layer 31, and in this case, the second hole segment 352B may be disposed only in the first structural part 32, or may include both a portion disposed in the bearing layer 31 and a portion disposed in the first structural part 32. Alternatively, the first hole segment 352A may include both the portion disposed in the bearing layer 31 and the portion disposed in the first structural part 32, and in this case, the second hole segment 352B is provided only in the first structural part 32. The plane portion F formed in this way may be disposed on the bearing layer 31, or may be disposed on the first structural part 32.

In some embodiments, as shown in FIG. 4E, a first hole segment 352A is provided in the bearing layer 31 and the first structural part 32, the second hole segment 352B is provided in the first structural part 32, and the edge that is of the first hole segment 352A and that is close to the second hole segment 352B is located in the region enclosed by the first closed connection line 321.

In these embodiments, that the edge that is of the first hole segment 352A and that is close to the second hole segment 352B is located in the region enclosed by the first closed connection line 321 means that the orthographic projection that is on the upper surface 31a of the bearing layer 31 and that is of the edge that is of the first hole segment 352A and that is close to the second hole segment 352B and an orthographic projection that is of the first closed connection line 321 and that is on the upper surface 31a of the bearing layer 31 overlap, or the orthographic projection that is on the upper surface 31a of the bearing layer 31 and that is of the edge that is of the first hole segment 352A and that is close to the second hole segment 352B is located in the region enclosed by the first closed connection line 321, and there is a gap G1 between the orthographic projection that is on the upper surface 31a of the bearing layer 31 and that is of the edge that is of the first hole segment 352A and that is close to the second hole segment 352B and the orthographic projection that is of the first closed connection line 321 and that is on the upper surface 31a of the bearing layer 31. In this case, a depth h1 of the first hole segment 352A is greater than a thickness d1 of the bearing layer 31, and the plane portion F is disposed on the first structural part 32, and corresponds to a portion that is of the first structural part 32 and that is from the edge that is of the first hole segment 352A and that is close to the second hole segment 352B to the edge that is of the second hole segment 352B and that is close to the first hole segment 352A.

In some embodiments, as shown in FIG. 4G, FIG. 4H, FIG. 4I, and FIG. 4J, the first hole segment 352A is provided in the bearing layer 31, and the edge that is of the first hole segment 352A and that is close to the second hole segment 352B is located in or outside the region enclosed by the first closed connection line 321.

Figure 4G:
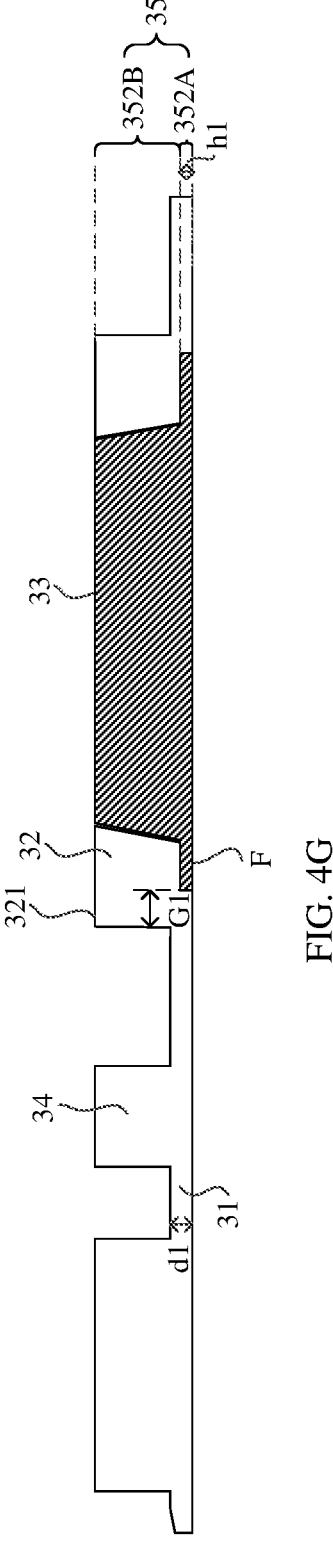
FIG. 4G is another sectional view in a direction B-B' in FIG. 4A according to an embodiment of this application.
Figure 4H:
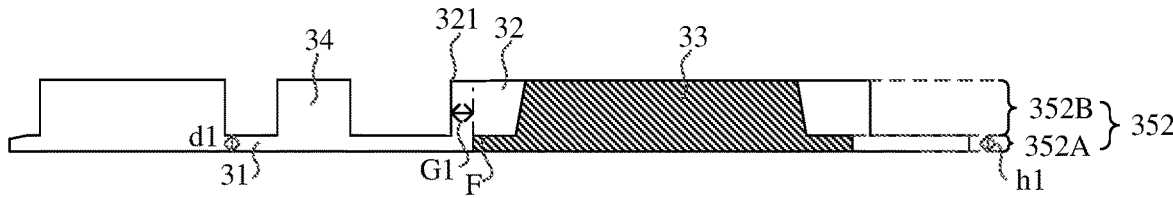
FIG. 4H is another sectional view in a direction B-B' in FIG. 4A according to an embodiment of this application.

In these embodiments, that the edge that is of the first hole segment 352A and that is close to the second hole segment 352B is located in the region enclosed by the first closed connection line 321 means that the orthographic projection that is on the upper surface 31a of the bearing layer 31 and that is of the edge that is of the first hole segment 352A and that is close to the second hole segment 352B and the orthographic projection that is of the first closed connection line 321 and that is on the upper surface 31a of the bearing layer 31 overlap, or the orthographic projection that is on the upper surface 31a of the bearing layer 31 and that is of the edge that is of the first hole segment 352A and that is close to the second hole segment 352B is located in the region enclosed by the first closed connection line 321, and there is a gap G1 between the orthographic projection that is on the upper surface 31a of the bearing layer 31 and that is of the edge that is of the first hole segment 352A and that is close to the second hole segment 352B and the orthographic projection that is of the first closed connection line 321 and that is on the upper surface 31a of the bearing layer 31. In this case, there are two possible cases. In the first case, as shown in FIG. 4G, the depth h1 of the first hole segment 352A is less than the thickness d1 of the bearing layer 31, and the plane portion F is disposed on the bearing layer 31, and corresponds to a portion that is of the bearing layer 31 and that is from the edge that is of the first hole segment 352A and that is close to the second hole segment 352B to the edge that is of the second hole segment 352B and that is close to the first hole segment 352A. In the second case, as shown in FIG. 4H, the depth h1 of the first hole segment 352A is equal to the thickness h1 of the bearing layer 31, and the plane portion F is disposed on the first structural part 33, and corresponds to the portion that is of the first structural part 33 and that is from the edge that is of the first hole segment 352A and that is close to the second hole segment 352B to the edge that is of the second hole segment 352B and that is close to the first hole segment 352A.

That the edge that is of the first hole segment 352A and that is close to the second hole segment 352B is located outside the region enclosed by the first closed connection line 321 means that the orthographic projection that is on the upper surface 31a of the bearing layer 31 and that is of the edge that is of the first hole segment 352A and that is close to the second hole segment 352B is located outside the region enclosed by the first closed connection line 321, and there is a gap G2 between the orthographic projection that is on the upper surface 31a of the bearing layer 31 and that is of the edge that is of the first hole segment 352A and that is close to the second hole segment 352B and the orthographic projection that is of the first closed connection line 321 and that is on the upper surface 31a of the bearing layer 31. If the edge that is of the first hole segment 352A and that is close to the second hole segment 352B is located outside the region enclosed by the first closed connection line 321, compared with a case in which the edge that is of the first hole segment 352A and that is close to the second hole segment 352B is located in the region enclosed by the first closed connection line 321, an area of a portion that is of the second structural part 33 and that is located in the first hole segment 352A may be increased, to increase a grabbing area and improve efficiency of mounting the second structural part 33 in the through-hole 352.

In this case, the edge that is of the first hole segment 352A and that is close to the second hole segment 352B is located in the region enclosed by the first closed connection line 321, that is, the whole edge that is of the first hole segment 352A and that is close to the second hole segment 352B is located in the region enclosed by the first closed connection line 321. The edge that is of the first hole segment 352A and that is close to the second hole segment 352B is located outside the region enclosed by the first closed connection line 321, that is, at least a part of the edge that is of the first hole segment 352A and that is close to the second hole segment 352B is located outside the region enclosed by the first closed connection line 321, that is, if the edge that is of the first hole segment 352A and that is close to the second hole segment 352B is located outside the region enclosed by the first closed connection line 321, the portion of the edge that is of the first hole segment 352A and that is close to the second hole segment 352B is located outside the region enclosed by the first closed connection line 321, or the whole edge that is of the first hole segment 352A and that is close to the second hole segment 352B is located outside the region enclosed by the first closed connection line 321.

Figure 4I:
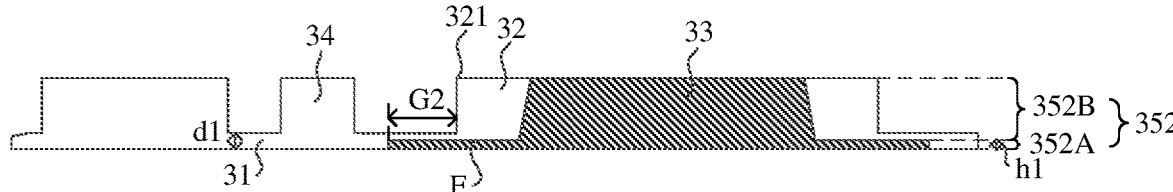
FIG. 4I is another sectional view in a direction B-B' in FIG. 4A according to an embodiment of this application.
Figure 4J:
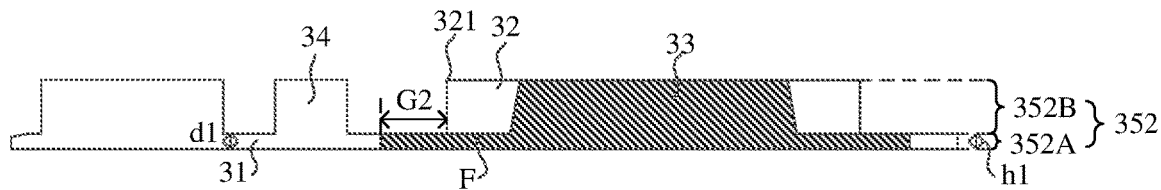
FIG. 4J is a sectional view of a decoration part according to an embodiment of this application.

In addition, similar to the case in which the edge that is of the first hole segment 352A and that is close to the second hole segment 352B is located in the region enclosed by the first closed connection line 321, if the edge that is of the first hole segment 352A and that is close to the second hole segment 352B is located outside the region enclosed by the first closed connection line 321, there may be two possible cases. In the first case, as shown in FIG. 4I, the depth h1 of the first hole segment 352A is less than the thickness d1 of the bearing layer 31, and the plane portion F is disposed on the bearing layer 31, and corresponds to the portion that is of the bearing layer 31 and that is from the edge that is of the first hole segment 352A and that is close to the second hole segment 352B to the edge that is of the second hole segment 352B and that is close to the first hole segment 352A. In the second case, as shown in FIG. 4J and FIG. 4K, the depth h1 of the first hole segment 352A is equal to the thickness h1 of the bearing layer 31, and the plane portion F is disposed on the first structural part 32, and corresponds to a portion that is of the first structural part 33 and that is from the first closed connection line 321 to the edge that is of the second hole segment 352B and that is close to the first hole segment 352A.

Figure 4K:
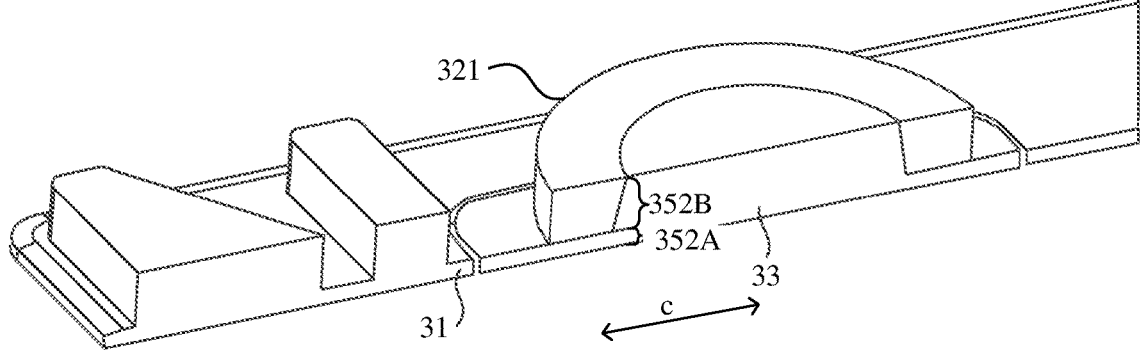
FIG. 4K is a side view of a section of FIG. 4J according to an embodiment of this application.

It should be noted that, as shown in FIG. 4K, if the portion of the edge that is of the first hole segment 352A and that is close to the second hole segment 352B is located outside the region enclosed by the first closed connection line 321, that is, for the letter "O", two portions of the edge that are of the first hole segment 352A, that are close to the second hole segment 352B, and that are in a linear direction (as a direction indicated by an arrow c in FIG. 4K) are located outside the region enclosed by the first closed connection line 321, in this case, a portion that is of the second structural part 33 and that is located in the first hole segment 352A may be placed in the first hole segment 352A, and is connected to the plane portion by using the second adhesive portion, so that the second structural part 33 is clamped and disposed in the through-hole 352.

In this case, the two portions of the edge that are of the first hole segment 352A, that are close to the second hole segment 352B, and that are in a linear direction (as the direction indicated by the arrow c in FIG. 4K) are located outside the region enclosed by the first closed connection line 321, and the second structural part 33 is manufactured into a form in which a portion that is located in the first hole segment 352A and that is along two sides of the linear direction extends beyond the region enclosed by the first closed connection line 321, to ensure connection reliability of the first structural part 32 and the second structural part 33 and facilitate processing.

In addition, the portion that is of the second structural part 33 and that is located in the first hole segment 352A is manufactured into a base-like structure, and the portion is located on a same layer as the bearing layer 31, so that an overall thickness of the decoration part 3 may be reduced in comparison with manufacturing the foregoing base-like structure on a side of the lower surface 31b of the bearing layer 31.

It should also be noted that, the foregoing merely shows a case in which the edge that is of the first hole segment 352A and that is close to the second hole segment 352B is located in the region enclosed by the first closed connection line 321 when the depth h1 of the first hole segment 352A is greater than the thickness d1 of the bearing layer 31. A person skilled in the art may understand that when the depth h1 of the first hole segment 352A is greater than the thickness d1 of the bearing layer 31, the edge that is of the first hole segment 352A and that is close to the second hole segment 352B alternatively may be located outside the region enclosed by the first closed connection line 321. In this case, the plane portion is disposed on the first structural part 32, and an upper surface of the portion that is of the second structural part 33 and that is located in the first hole segment 352A may be higher than the upper surface 31a of the bearing layer 31, that is, a portion that is of the first hole segment 352A other than a part corresponding to the region enclosed by the first closed connection line 321, penetrates through the upper surface 31a and the lower surface 31b of the bearing layer 31, and a part of the portion that is of the second structural part 33 and that is located in the first hole segment 352A is located outside the bearing layer 31 and the first structural part 32.

Only an example in which a side surface that is of the first structural part 32 and that is corresponding to the first closed connection line 321 is a vertical side surface is used for description. If the side surface that is of the first structural part 32 and that is corresponding to the first closed connection line 321 is a inclined side surface, as shown in FIG. 4E, the first hole segment 352A is provided in the bearing layer 31 and the first structural part 32, and a difference is that an edge that is of the first structural part 32 and that is close to the bearing layer 31 is located in the region enclosed by the first closed connection line 321. In this case, the edge that is of the first hole segment 352A and that is close to the second hole segment 352B is located outside a region enclosed by the edge that is of the first structural part 32 and that is close to the bearing layer 31, and the portion that is of the second structural part 33 and that is located in the first hole segment 352A is located outside the bearing layer 31 and the first structural part 32. Alternatively, the edge that is of the first structural part 32 and that is close to the bearing layer 31 is located outside the region enclosed by the first closed connection line 321. In this case, the edge that is of the first hole segment 352A and that is close to the second hole segment 352B is located outside the region enclosed by the edge that is of the first structural part 32 and that is close to the bearing layer 31, and therefore, no through-hole is formed in the region that is of the bearing layer 31 and that is not covered by the first structural part 32. In this case, the portion that is of the second structural part 33 and that is located in the first hole segment 352A is located in the bearing layer 31 and the first structural part 32.

Figure 5E:
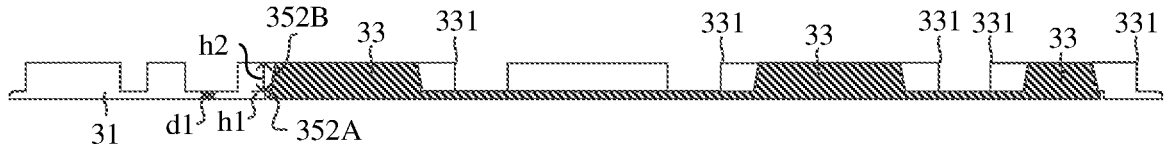
FIG. 5E is a sectional view of another decoration part according to an embodiment of this application.
Figure 5F:
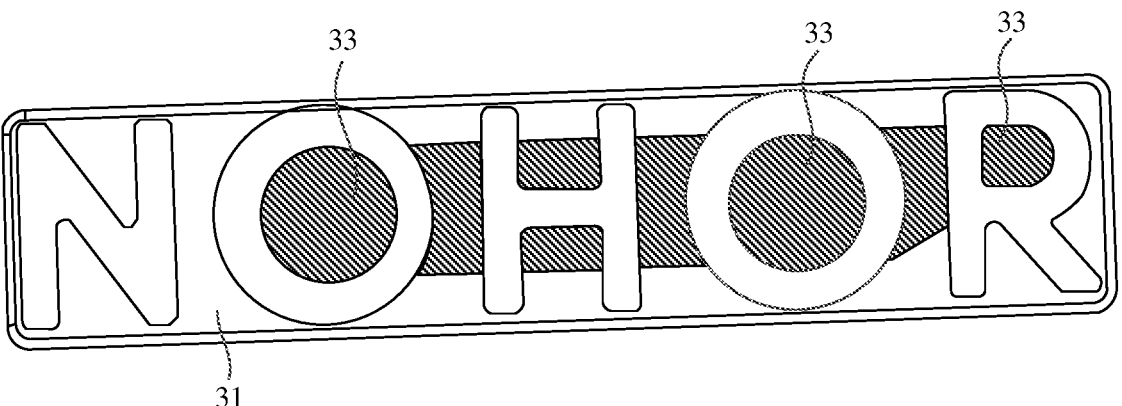
FIG. 5F is a top view of FIG. 5E according to an embodiment of this application.

In some embodiments, as shown in FIG. 5A and FIG. 5B, there are a plurality of second structural parts 33. As shown in FIG. 5C, the plurality of second structural parts 33 each are disposed independently. Alternatively, as shown in FIG. 5D, FIG. 5E, and FIG. 5F, portions that are of the plurality of second structural parts 33 and that are located in the first hole segments 352A are connected as an integral structure.

In these embodiments, if the plurality of second structural parts 33 each are disposed independently, a longitudinal section of each through-hole 352 may be trapezoidal or rectangular; or each through-hole 352 may include, along a direction gradually away from the lower surface 31b of the bearing layer 31, the first hole segment 352A and the second hole segment 352B that are sequentially connected, for example, each through-hole 352 may be of a structure as shown in FIG. 4E. If each through-hole 352 includes, along the direction gradually away from a second surface 31b, the first hole segment 352A and the second hole segment 352B that are sequentially connected, depths h1 of the first hole segments 352A of all through-holes 352 may be the same or different, and depths h2 of the second hole segments 352B may be the same or different.

If portions that are of the plurality of second structural parts 33 and that are located in the first hole segments 352A are connected as an integral structure, the first hole segments 352A of all through-holes 352 are connected to each other. In this case, the depths h1 of the first hole segments 352A of all through-holes 352 may be the same or different. As shown in FIG. 5E and FIG. 5F, if the depths h1 of the first hole segment 352A of all through-holes 352 each are the same, and are the same as the thickness d1 of the bearing layer 31, portions that are of the plurality of second structural parts 33 and that are located in the first hole segments 352A are connected as an integral structure. In this case, a position that is of the bearing layer 31 and that is corresponding to a connection portion of the first hole segment 352A is hollowed out. Portions that are of the plurality of second structural parts 33, that are located in the first hole segments 352A and that are connected to each other each may be referred to as a connection edge, the connection edge may be disposed, for example, between two adjacent second structural parts 33, and the two second structural parts 33 are connected as an integral structure by using connection edges thereof.

For example, a LOGO logo is letters "NOHOR", and if the plurality of second structural parts 33 each are disposed independently, a longitudinal section of the through-hole 352 in the letter "O" may be tapered or truncated cone shaped, a longitudinal section of the through-hole 352 in the letter "R" may also be tapered or truncated cone shaped, and a second structural part 33 in the letter "O" and a second structural part 33 in the letter "R" each are independent of each other. If the portions that are of the plurality of second structural parts 33 and that are located in the first hole segments 352A are connected as an integral structure, as shown in FIG. 5D and FIG. 5E, through-holes 352 in the two letters "O" and the through-hole 352 in the letter "R" each include the first hole segment 352A and the second hole segment 352B, and edges of the first hole segments 352A in the two letters "O" and the first hole segment 352A in the letter "R" (in this case, also referred to as edges that are of two adjacent letters and that are close to each other) each are located outside a region thereof enclosed by the first closed connection line 321, and are connected as an integral structure. For example, in the letters "NOHOR", a position that is of the letter "H" in a middle of the two letters "O" and that is corresponding to the hole segment 352A is also hollowed out, so that the edges of the two letters "O" and that are close to each other are opened up, and edges that are of "R" and are of "O" that is close to "R" and that are close to each other are opened up, to enable portions that are of the second structural parts 33 in the two letters "O" and that are located in the first hole segments 352A to cross the letter "H" and to be connected to a portion that is of the second structural part 33 in the letter "R" and that is located in the first hole segment 352A as an integral structure. As shown in FIG. 5F, if the depth h1 of each first hole segment 352A is equal to the thickness d1 of the bearing layer 31, positions that are of the bearing layer 31 and that are corresponding to two letters "O", letter "H", and letter "R" each are hollowed out.

Figure 6A:
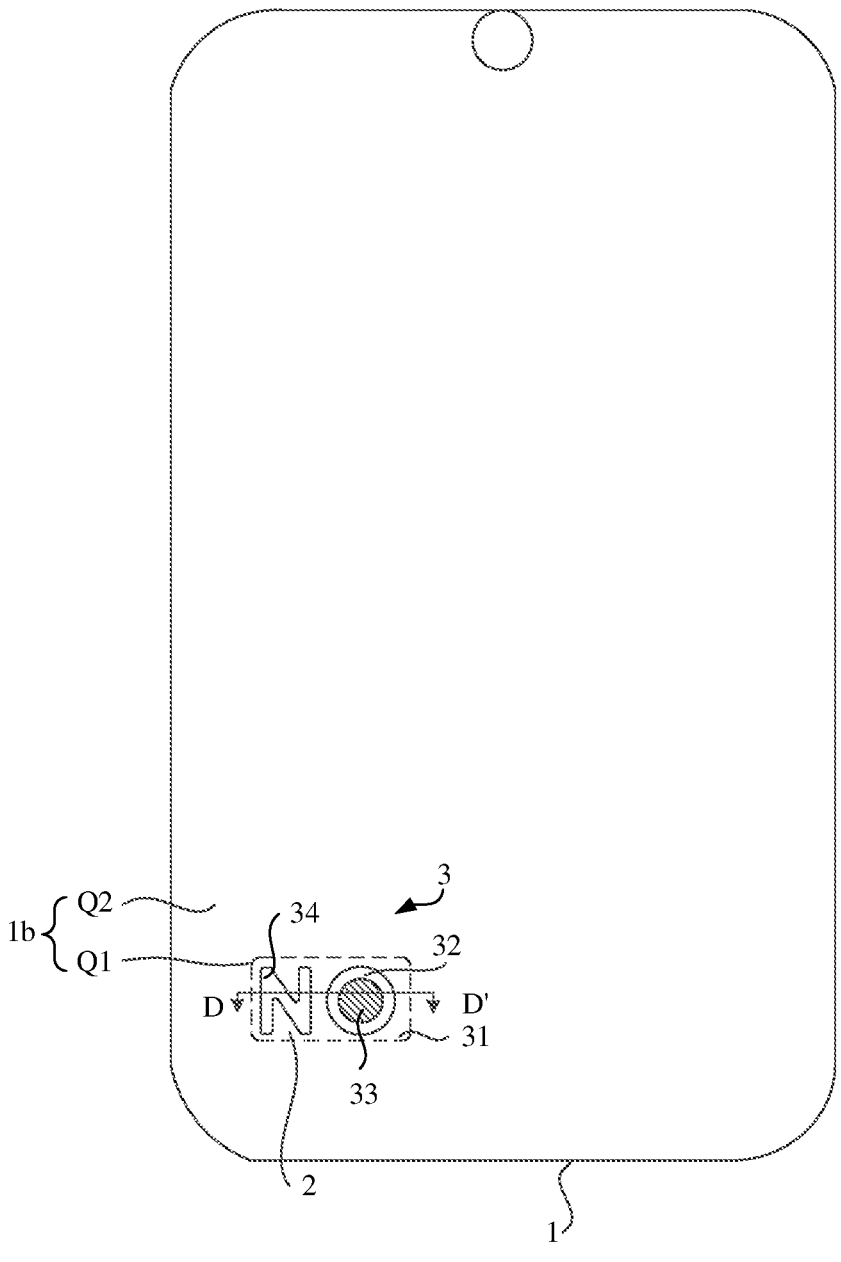
FIG. 6A is a top view of a housing of another electronic device according to an embodiment of this application.
Figure 6B:
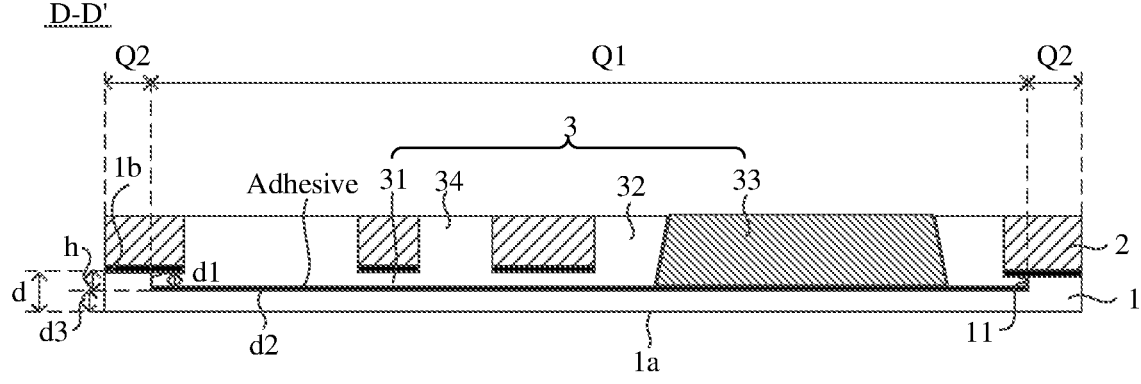
FIG. 6B is a sectional view in a direction D-D' in FIG. 6A according to an embodiment of this application.

Based on the foregoing structure, in some embodiments, as shown in FIG. 6A and FIG. 6B, an outer surface 1b of a base layer 1 includes a first region Q1 and a second region Q2, and the first region Q1 and the second region Q2 are adjacent to each other. A decoration part 3 is disposed on the outer surface 1b of the base layer 1 and located in the first region Q1, and the decoration part 3 may be connected to the base layer 1 by using a bearing layer 31. For example, the decoration part 3 may be connected by using adhesive disposed between the bearing layer 31 and the base layer 1. A first decoration layer 2 includes a portion covering the second region Q2 and a portion covering the first region Q1 except a region enclosed by a first closed connection line 321. That is, the first decoration layer 2 covers the second region Q2 and a region that is of the first region Q1 and that is not covered by a first structural part 32 and a second structural part 33. The second region Q2 may be a region, other than the first region Q1, that is on the outer surface 1b of the base layer 1; that is, the first decoration layer 2 covers all regions that are of the base layer 1 and that are not covered by the first structural part 32 and the second structural part 33.

That is, the foregoing embodiment shows a case in which the decoration part 3 only includes the first structural part 32 and the second structural part 33, and a person skilled in the art can understand that if the decoration part 3 further includes a third structural part 34, the first decoration layer 2 includes the portion covering the second region Q2 and a portion covering the first region Q1 except a region enclosed by the first closed connection line 321 and a third closed connection line 341. In this case, if the second region Q2 is a region, other than the first region Q1, that is on the outer surface 1b of the base layer 1, the first decoration layer 2 covers all regions that are of the base layer 1 and that are not covered by the first structural part 32, the second structural part 33, and the third structural part 34.

Figure 6C:
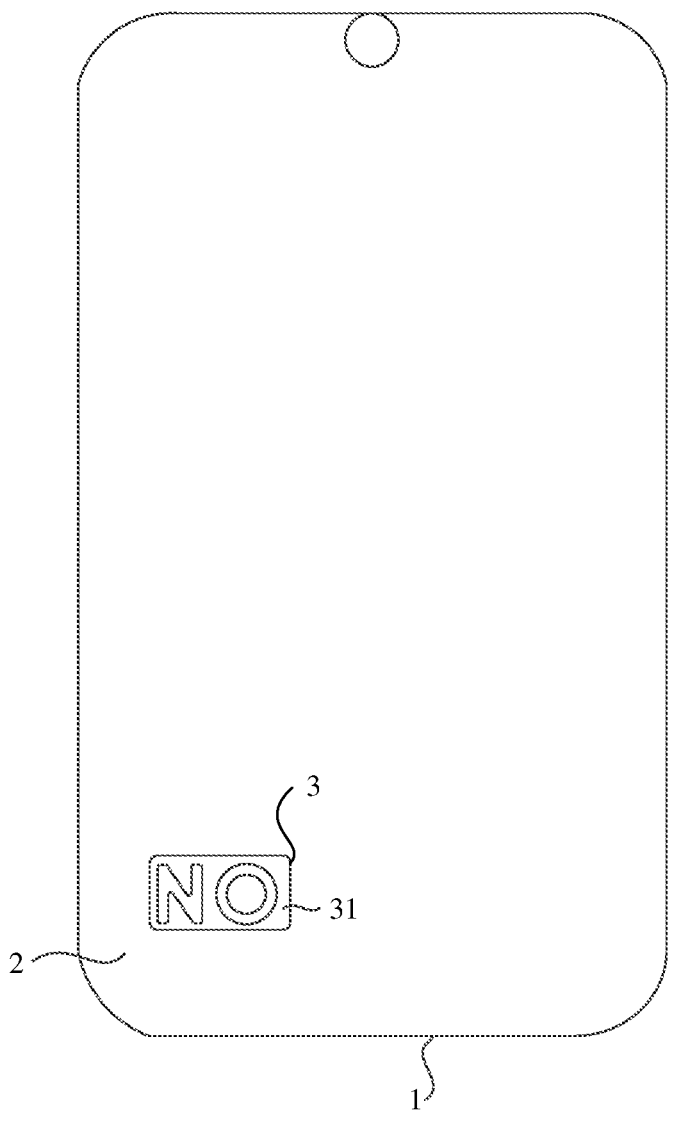
FIG. 6C is a top view of a housing of an electronic device according to a related technology.
Figure 6D:
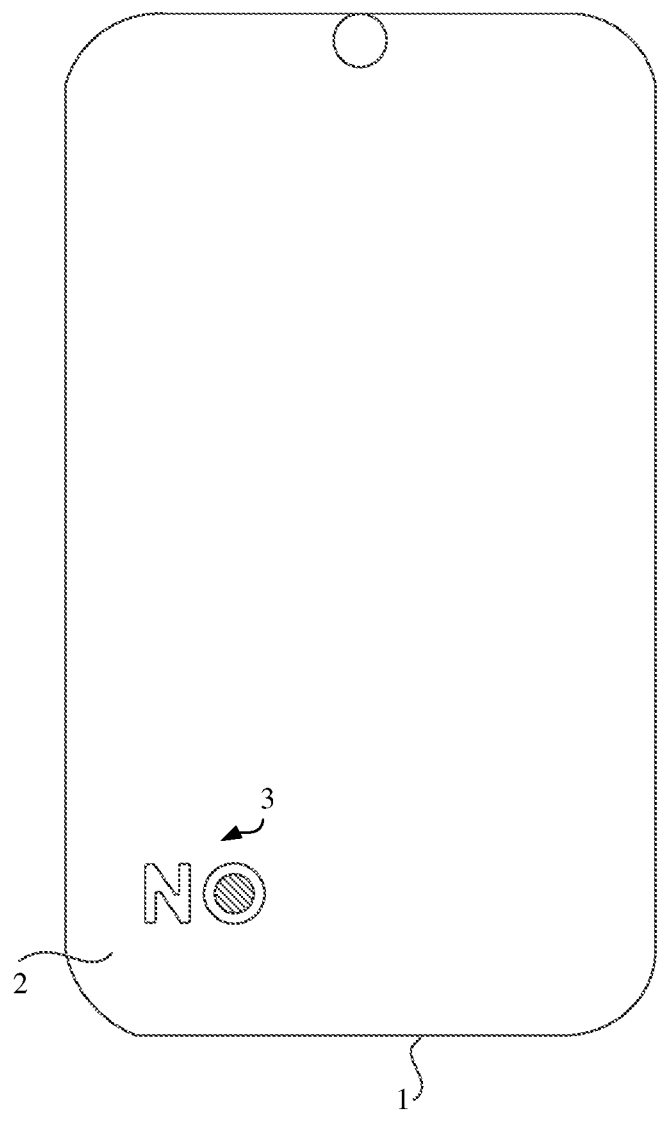
FIG. 6D is a diagram of an appearance effect of FIG. 6A according to an embodiment of this application.

In these embodiments, in comparison with a case that in a related technology, as shown in FIG. 6C, the decoration part 3 is sheet-shaped and includes the bearing layer 31, and a LOGO pattern formed on a surface of the bearing layer 31 by using a printing or laser process, and the LOGO pattern is a plane pattern (as shown in FIG. 6C, the LOGO pattern is letters "NO"), the first structural part 32, the second structural part 33, and the third structural part 34 in the decoration part 3 have specific thicknesses, so that an overall thickness of the decoration part 3 may be increased, thereby improving firmness of combination between the decoration part 3 and the base layer 1 and avoiding falling. In addition, in comparison with the related technology in which the decoration part 3 is adhered to the first decoration layer 2 by using the adhesive (such as hot melt adhesive), as shown in FIG. 6A and FIG. 6B, in addition to being adhered to the base layer 1 by using the adhesive, the decoration part 2 may be covered by the first decoration layer 2, so that the firmness of combination between the decoration part 3 and the base layer 1 may be further improved. Further, because the first decoration layer 2 covers the second region Q2 and a region that is of the first region Q1 and that is not covered by the first structural part 32, the second structural part 33, and the third structural part 34, the first decoration layer 2 may continuously cover at a transition position of the base layer 1 and the bearing layer 31, so as to avoid forming a gap at the transition position of the base layer 1 and the bearing layer 31 of the decoration part 3, and obtain an appearance effect as shown in FIG. 6D. Further, the first decoration layer 2 covers the region that is of the first region Q1 and that is not covered by the first structural part 32, the second structural part 33 and the third structural part 34, to make transition between the first decoration layer 2 and each of the first structural part 32 and the third structural part 34 more natural, so as to better highlight an appearance profile of the LOGO pattern and make the LOGO display more conspicuous, thereby further improving an appearance.

Figure 6E:
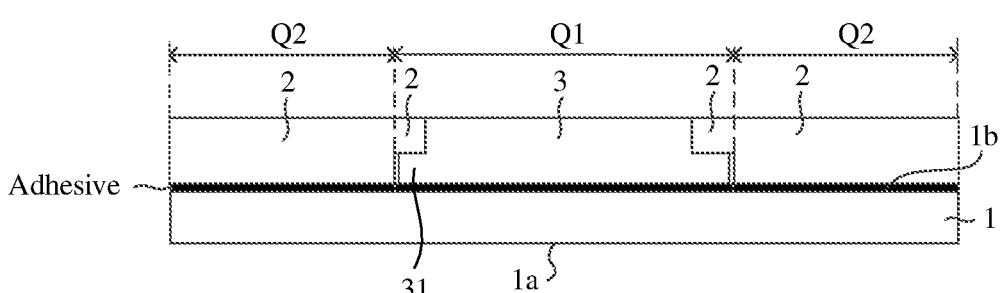
FIG. 6E is a structural diagram in which a decoration part is covered by a thinned decoration layer according to an embodiment of this application.

For example, the first decoration layer 2 is vegan leather, if the first decoration layer 2 covers the second region Q2 and the region that is of the first region Q1 and that is not covered by the first structural part 32, the second structural part 33, and the third structural part 34, as shown in FIG. 6E, a portion of the region that is of the first region Q1 and that is not covered by the first structural part 32, the second structural part 33, and the third structural part 34 may be thinned (for example, thinned through hot stamping), so that a portion that is of the first decoration layer 2 and that covers the second region Q2 and a portion that is of the first decoration layer 2 and that covers the first region Q1 are partially flush.

The foregoing describes a solution in which the decoration part 3 is directly fastened to the outer surface 1b of the base layer 1. In this solution, as shown in FIG. 6E, a thickness of the base layer 1 does not change. A difference is that if a portion that is of the second structural part 33 and that is located in a first hole segment 352A is manufactured into a base-like structure, and the portion is located on a same layer as the bearing layer 31, an overall thickness of the decoration part 3 may be reduced in comparison with manufacturing the foregoing base-like structure on a side of the lower surface 31b of the bearing layer 31, so that an overall thickness of the housing can be minimized. In addition, because the thickness of the base layer 1 does not change, the solution is also suitable for manufacturing an ultra-thin base layer 1.

In some embodiments, as shown in FIG. 6B, a position that is of the outer surface 1b of the base layer 1 and that is corresponding to the first region Q1 is provided with a second groove 11, and the bearing layer 31 is disposed in the second groove 11. Because the thickness d of the base layer 1 may be reduced by disposing the second groove 11 in the base layer 1, the solution is not suitable for manufacturing a product with an ultra-thin base layer 1.

For example, in some embodiments, using the thickness d of the base layer 1 is 0.2-0.45 mm as an example, a thickness d1 of the bearing layer 31 may be 0.1-0.3 mm, and a thickness d2 of adhesive between the base layer 1 and the bearing layer 31 may be 0.01-0.05 mm. In this case, a depth h of the second groove 11 is equal to a sum of the thickness d1 of the bearing layer 31 and the thickness d2 of the adhesive. A thickness d3 (that is, a thickness of the base layer 1 after a groove in the base layer 1 is cut) of the position that is of the base layer 1 and that is corresponding to the first region Q1 may be 0.1-0.3 mm.

In addition, the portion that is of the second structural part 33 and that is located in the first hole segment 352A is manufactured into a base-like structure, and the portion is located on the same layer as the bearing layer 31, and therefore the depth of the second groove 11 may be reduced in comparison with manufacturing the foregoing base-like structure on the side of the lower surface 31b of the bearing layer 31, to avoid digging through the base layer 1.

In some embodiments, if a total thickness h of the bearing layer 31 and the adhesive is greater than 0.15 mm, and the thickness d of the base layer 1 is less than 0.3 mm, the thickness d3 of a position that is of the base layer 1 and that is corresponding to the second groove 11 may be less than 0.15 mm, and this may result in a risk of insufficient strength of the base layer 1.

Figure 6F:
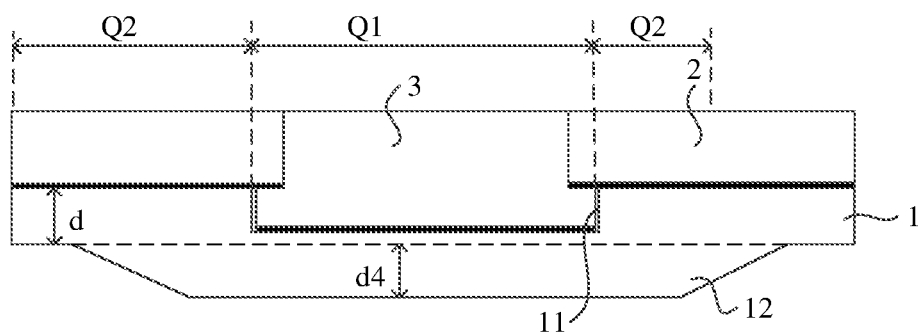
FIG. 6F is a structural diagram of forming a protrusion on a base layer according to an embodiment of this application.

Based on this, in some embodiments, as shown in FIG. 6F, the position that is of the base layer 1 and that is corresponding to the second groove 11 has a protrusion 12 towards a side that is away from the bearing layer 31. That is, the position that is of the base layer 1 and that is corresponding to the second groove 11 is thickened, to ensure that a thickened base layer 1 has a specific thickness after the groove is cut, thereby ensuring strength of the base layer 1.

In some embodiments, for example, the thickness d of the base layer 1 is 0.2-0.45 mm, a height d4 of the protrusion 12 may be 0.05-0.2 mm, to ensure that the base layer 1 has a relatively high strength as a whole.

In some embodiments, the base layer 1 is a fiber composite board. The fiber composite board is made of a composite material, the composite material includes two parts: a matrix and a reinforcing material. The matrix may be a metal matrix, a ceramic matrix, a resin matrix, or the like. The matrix of the fiber composite board is a resin matrix, and the reinforcing material is fiber. The fiber composite board is formed by winding, molding or pultrusion of these fiber materials and matrixes. The fiber composite board has high strength, high modulus, good corrosion resistance, and good durability.

Fibers in the fiber composite plate are selected from aramid fibers, glass fibers, carbon fibers, or the like. That is, the base layer 1 may be an aramid fiber composite board, a glass fiber composite board, or a carbon fiber composite board. Resin in the fiber composite board is thermosetting resin, thermoplastic resin, and/or the like. For example, the resin in the fiber composite board may be one or a combination of more of PC (Polycarbonate, polycarbonate), PA (Polyamide, polyamide), PMMA (poly (methyl methacrylate), polymethyl methacrylate), and ABS (Acrylonitrile Butadiene Styrene, acrylonitrile-butadiene-styrene copolymer).

In some embodiments, the fiber composite board is a high modulus continuous fiber reinforced composite board. The continuous fiber reinforced composite board is a composite board made of a composite material that uses a continuous fiber as a reinforcing material and uses a resin matrix as a matrix, so that strength of the base layer 1 is further improved.

Certainly, the foregoing is merely an example, and the base layer 1 may alternatively be a plastic board, a metal board, or the like. This is not specifically limited herein.

Figure 6G:
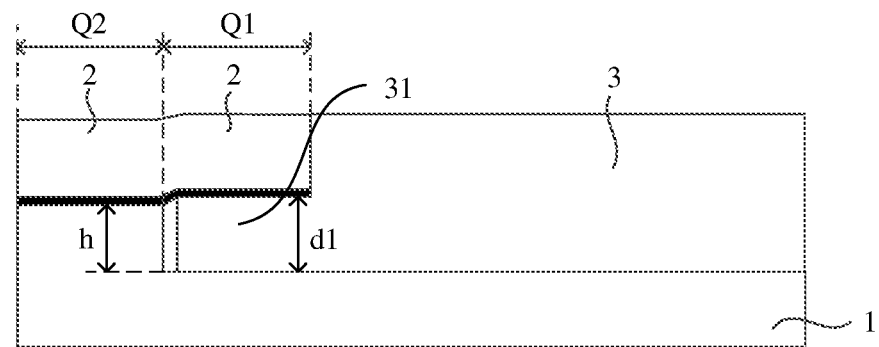
FIG. 6G is a structural diagram in which no chamfer is disposed at an edge of an upper surface of a bearing layer according to the embodiment of this application.

It should be noted that if the bearing layer 31 is placed in the second groove 11, and an upper surface 31a of the bearing layer 31 is flush with the outer surface 1b of the base layer 1, when the first decoration layer 2 (for example, vegan leather) covers the second region Q2 and the region that is of the first region Q1 and that is not covered by the first structural part 32, the second structural part 33, and the third structural part 34, the surface of the first decoration layer 2 is in a same plane and has a good appearance effect. However, in an actual manufacturing process, as shown in FIG. 6G, due to processing errors of different structural parts, when the thickness d1 of the bearing layer 31 is greater than the depth h of the second groove 11 due to a tolerance, a segment gap mark is formed on the surface of the first decoration layer 2.

Figure 6H:
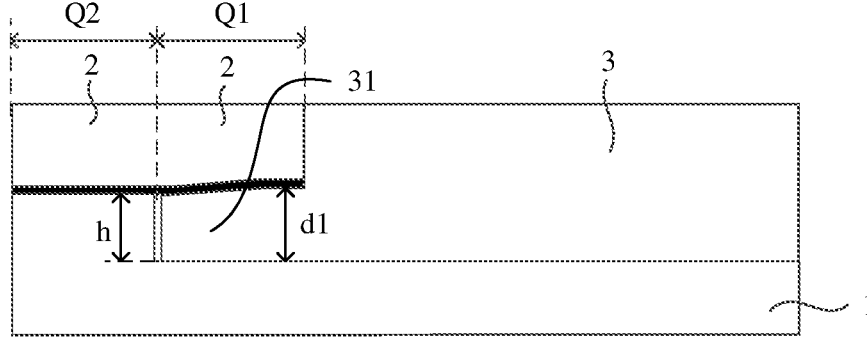
FIG. 6H is a structural diagram in which an edge of an upper surface of a bearing layer is provided with a chamfer according to an embodiment of this application.

Therefore, in some embodiments, as shown in FIG. 6H, an edge of the upper surface 31a of the bearing layer 31 is provided with a chamfer. With reference to FIGS. 6G and 6H, by disposing a chamfer on the edge of the upper surface 31a of the bearing layer 31, the transition of a segment gap between the bearing layer 31 and the base layer 1 is smoother, so that adhesion strength of the first decoration layer 2 on the base layer 1 and the bearing layer 31 may be improved without forming the segment gap mark on an outer surface of the first decoration layer 2.

The foregoing describes a mating structure between the decoration part 3 and the base layer 1. In the following embodiment, the structure of the decoration part 3 and a technical effect of the structure on a mating relationship between the decoration part 3 and the base layer 1 will continue to be described.

In some embodiments, as shown in FIG. 6B, the second structural part 33 does not extend beyond the lower surface 31b of the bearing layer 31. In this case, if the bearing layer 31 is disposed in the second groove 11, the depth h of the second groove 11 may be equal to the sum of the thickness d1 of the bearing layer 31 and the thickness d2 of the adhesive between the bearing layer 31 and the base layer 1, so that a groove depth may be reduced to a maximum extent, and the solution may be used for manufacturing the ultra-thin base layer.

For example, in some embodiments, as shown in FIG. 6B, the lower surface 33b of the second structural part 33 is flush with the lower surface 31b of the bearing layer 31.

In these embodiments, a small enough groove depth can be ensured, and it is possible to increase an adhesive area between the decoration part 3 and the base layer 31, for example, adhesive is provided on both the lower surface 31b of the bearing layer 31 and the lower surface 33b of the second structural part 33, so that the adhesive strength of the decoration part 3 and the base layer 31 can be further increased. In addition, by making the lower surface 33b of the second structural part 33 flush with the lower surface 31b of the bearing layer 31, after the decoration part 3 and the base layer 1 are fastened, because of a supporting effect of the base layer 1, the second structural part 33 may also be prevented from moving in the through-hole 352, thereby further improving an appearance effect of the LOGO.

During manufacturing, there is a tolerance between a thickness D1 of the second structural part 33 and a total thickness D of the first structural part 32 and the bearing layer 31, so that the lower surface 31b of the bearing layer 31 and the lower surface 33b of the second structural part 33 cannot be completely flush. To ensure that the lower surface 33b of the second structural part 33 and the lower surface 31b of the bearing layer 31 are flush, as shown in FIG. 6I, the first structural part 32, the bearing layer 31 and the second structural part 33 with thicknesses greater than designed values may be assembled together, and then a CNC (Computer Numerical Control, computer numerical control) process may be used to cut an appearance surface to a required thickness to make the lower surface 33b of the second structural part 33 flush with the lower surface 31b of the bearing layer 31, where a dashed-line in FIG. 6I indicates a cutting position.

Certainly, an upper surface 33a of the second structural part 33 and an upper surface 32a of the first structural part 32 may be flush in the foregoing manner, so as to further improve the appearance effect.

Figures 6I, 6J:
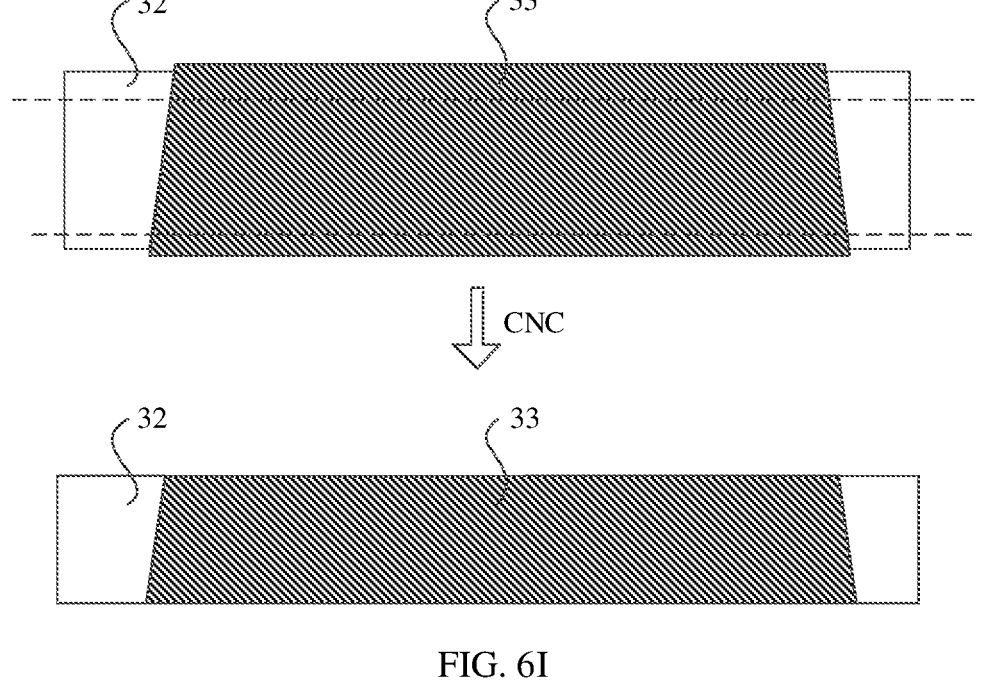
FIG. 6I is a flowchart in which a lower surface of a second structural part is flush with a lower surface of a bearing layer, and an upper surface of the second structural part is flush with an upper surface of the first structural part, according to an embodiment of this application.
FIG. 6J is a structural diagram in which a bearing layer of another decoration part is disposed in a second groove according to an embodiment of this application.

In some embodiments, as shown in FIG. 6J, the decoration part 3 further includes a base 36, the base 36 is disposed on a side of the lower surface 31b of the bearing layer 31, and the base 36 is connected to at least one second structural part 33. An edge of the base 36 extends beyond an orthographic projection that is of each second structural part 33 and that is on the upper surface 31a of the base layer 31, a third adhesive portion 6 is disposed between the base 36 and the bearing layer 31, and the base 36 and the bearing layer 31 are connected by using the third adhesive portion 6.

The orthographic projection that is of the second structural part 33 and that is on the upper surface 31a of the base layer 31 is an orthographic projection that is of a thickness portion that has a largest area in the second structural part 33 and that is on the upper surface 31a of the base layer 31. For example, if the second structural part 33 includes the portion located in the first hole segment 352A and a portion located in the second hole segment 352B, and an orthographic projection that is of the portion that is of the second structural part 33 and that is located in the first hole segment 352A and that is on the upper surface 31a of the bearing layer 31 is located outside the region enclosed by the first closed connection line 321, the orthographic projection that is of the second structural part 33 and that is on the upper surface 31a of the bearing layer 31 refers to the orthographic projection that is of the portion that is of the second structural part 33 and that is located in the first hole segment 352A and that is on the upper surface 31a of the bearing layer 31.

In these embodiments, by disposing a base 36, the edge of the base 36 extends beyond the orthographic projection that is of each second structural part 33 and that is on the upper surface 31*a* of the base layer 31, and therefore, the base 36 has a relatively large area, and a grabbing area can be further increased, thereby further improving efficiency of assembling the second structural part 33 in the through-hole 352.

For example, as shown in FIG. 6J, the edge of the base 36 is flush with an edge of the bearing layer 31.

In some embodiments, a plurality of second structural parts 33 and the base 36 may be of an integral structure, so that the plurality of second structural parts 33 can be easily mounted in all through-holes 352 under the driving of the base 36.

In the foregoing embodiment, for example, the third adhesive portion 6 may alternatively be hot melt adhesive. In addition, if the decoration part 3 further includes the base 36, when the bearing layer 31 is disposed in the second groove 11, the decoration part 3 is connected to the base layer 1 by using the base 36, and in this case, the base 36 and the base layer 31 may alternatively be connected by using adhesive, the depth h of the second groove 11 is equal to a sum of the thickness d1 of the bearing layer 31, a thickness D2 of the base, a thickness d6 of the adhesive between the base 36 and the base layer 31 and a thickness d5 of the third adhesive portion 6, so that the depth h of the second groove 11 is relatively great. For example, if the sum of the thickness d1 of the bearing layer 31, the thickness D2 of the base 36, the thickness d6 of the adhesive between the base 36 and the base layer 31, and the thickness d5 of the third adhesive portion 6 is greater than 0.4 mm, the second groove 11 with a depth of at least 0.4 mm needs to be processed on the base layer 31, and in a case in which the base layer 1 is not dug through, the thickness d of the base layer 1 is greater than 0.5 mm, so that the solution cannot be used for manufacturing the base layer 1 with a thickness smaller than 0.5 mm.

In this case, as shown in FIG. 6E, the second groove 11 may not be disposed in the base layer 1, and the decoration part 3 may be directly fastened on the outer surface 1*b* of the base layer 1. Although a thickness of the housing is increased as a whole, this solution may be used for manufacturing an ultra-thin base layer 1 may be applied.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A structure configured to be disposed on a housing of an electronic device, the structure comprising:
   a bearing layer with an upper surface and a lower surface;
   at least one first structural part, disposed on the upper surface of the bearing layer, wherein an edge of an upper surface of the at least one first structural part forms a first closed connection line, and the upper surface of the at least one first structural part faces away from the bearing layer; and
   at least one second structural part, wherein each second structural part is located in a region enclosed by the first closed connection line, and along a direction that is directed from the upper surface of the bearing layer to the lower surface of the bearing layer, the at least one second structural part comprises an upper surface and a lower surface that are arranged successively, and an edge of the upper surface of the at least one second structural part forms a second closed connection line;
   wherein a digging hole extends in the upper surface of the at least one first structural part and is located in the region enclosed by the first closed connection line, and the at least one second structural part is disposed in the digging hole;
   wherein the digging hole is a through-hole penetrating through the upper surface of the first structural part and the lower surface of the bearing layer;
   wherein along a direction extending away from the lower surface of the bearing layer, the through-hole comprises a first hole segment and a second hole segment over the first hole segment, the first hole segment being wider than the second hole segment in a cross-sectional view, an edge of the lower surface of the bearing layer defining an edge of the first hole segment, an edge of the upper surface of the at least one first structural part defining an edge of the second hole segment, a lower surface of the at least one first structural part extending from the edge of the first hole segment to the edge of the second hole segment, the at least one second structural part being disposed in the first hole segment and the second hole segment, and the lower surface of the at least one first structural part overlapping a lower region of the at least one second structural part; and
   wherein the lower surface of the at least one first structural part is disposed at a level higher than a level of the upper surface of the bearing layer.

2. The structure of claim 1, wherein a longitudinal section of the first hole segment of the through-hole is trapezoidal or rectangular.

3. The structure of claim 2, wherein a first adhesive is disposed between an outer wall of the second structural part and an inner wall of the through-hole, and the at least one second structural part and the through-hole are connected by using the first adhesive.

4. The structure of claim 1, wherein a longitudinal section of the second hole segment of the through-hole is trapezoidal or rectangular.

5. The structure of claim 1, wherein a second adhesive extends continuously from an upper surface of the lower region of the at least one second structural part to the lower surface of the at least one first structural part, and the at least one second structural part and the lower surface of the at least one first structural part are connected by using the second adhesive.

6. The structure of claim 1, wherein the first hole segment extends in the bearing layer and the at least one first structural part, the second hole segment extends in the first structural part, and the edge that is of the first hole segment and that is adjacent to the second hole segment is located in the region enclosed by the first closed connection line.

7. The structure of claim 1, wherein the first hole segment extends in the bearing layer, and the edge that is of the first hole segment and that is adjacent to the second hole segment is located in or outside the region enclosed by the first closed connection line.

8. The structure of claim 1, wherein a depth of the first hole segment is greater than a thickness of the bearing layer.

9. The structure of claim 7, wherein a depth of the first hole segment is less than or equal to a thickness of the bearing layer.

10. An electronic device, comprising:

a base layer, wherein an outer surface of the base layer comprises a first region and a second region, and the first region and the second region are adjacent to each other;

a decoration part, wherein the decoration part is disposed on the outer surface of the base layer and located in the first region, and the decoration part is connected to the base layer by using a bearing layer; and a decoration layer, wherein the decoration layer comprises a portion covering the second region and a portion covering the first region except a region enclosed by a first closed connection line;

wherein the decoration part comprises:

the bearing layer with an upper surface and a lower surface;

at least one first structural part, disposed on the upper surface of the bearing layer, wherein an edge of an upper surface of the at least one first structural part forms the first closed connection line, and the upper surface of the at least one first structural part faces away from the bearing layer; and at least one second structural part, wherein each second structural part is located in a region enclosed by the first closed connection line, and along a direction that is directed from the upper surface of the bearing layer to the lower surface of the bearing layer, the at least one second structural part comprises an upper surface and a lower surface that are arranged successively, and an edge of the upper surface of the at least one second structural part forms a second closed connection line;

wherein a digging hole extends in the upper surface of the at least one first structural part and is located in the region enclosed by the first closed connection line, and the at least one second structural part is disposed in the digging hole;

wherein the digging hole is a through-hole penetrating through the upper surface of the first structural part and the lower surface of the bearing layer; and wherein along a direction extending away from the lower surface of the bearing layer, the through-hole comprises a first hole segment and a second hole segment over the first hole segment, the first hole segment being wider than the second hole segment in a cross-sectional view, an edge of the lower surface of the bearing layer defining an edge of the first hole segment, an edge of the upper surface of the at least one first structural part defining an edge of the second hole segment, a lower surface of the at least one first structural part providing a plane surface extending from the edge of the first hole segment to the edge of the second hole segment, the at least one second structural part being disposed in the first hole segment and the second hole segment, and the lower surface of the at least one first structural part overlapping a lower region of the at least one second structural part; and wherein the lower surface of the at least one first structural part is disposed at a level higher than a level of the upper surface of the bearing layer.

11. The electronic device of claim 10, wherein a longitudinal section of the first hole segment of the through-hole is trapezoidal or rectangular.

12. The electronic device of claim 11, wherein a first adhesive is disposed between an outer wall of the at least one second structural part and an inner wall of the through-hole, and the at least one second structural part and the through-hole are connected by using the first adhesive.

13. The electronic device of claim 10, wherein a longitudinal section of the second hole segment of the through-hole is trapezoidal or rectangular.

14. The electronic device of claim 10, wherein a second adhesive extends continuously from an upper surface of the lower region of the at least one second structural part to the lower surface of the at least one first structural part, and the at least one second structural part and the lower surface of the at least one first structural part are connected by using the second adhesive.

15. The electronic device of claim 10, wherein the first hole segment extends in the bearing layer and the at least one first structural part, the second hole segment extends in the at least one first structural part, and the edge that is of the first hole segment and that is adjacent to the second hole segment is located in the region enclosed by the first closed connection line.

16. The electronic device of claim 10, wherein the first hole segment extends in the bearing layer, and the edge that is of the first hole segment and that is adjacent to the second hole segment is located in or outside the region enclosed by the first closed connection line.

17. A structure configured to be disposed on a housing of an electronic device, the structure comprising:

a bearing layer with an upper surface and a lower surface;

at least one first structural part, disposed on the upper surface of the bearing layer, wherein an edge of a first upper surface of the at least one first structural part forms a first closed connection line, and the first upper surface of the at least one first structural part faces away from the bearing layer; and at least one second structural part, wherein each second structural part is disposed on a second upper surface of the at least one first structural part and located in a region enclosed by the first closed connection line, the second upper surface of the at least one first structural part being disposed at a level between a level of the first upper surface of the at least one first structural part and a level of the upper surface of the bearing layer, the second upper surface of the at least one first structural part covering an entire lower surface of the at least one second structural part in a cross-sectional view, and along a direction that is directed from the upper surface of the bearing layer to the lower surface of the bearing layer, the at least one second structural part comprises an upper surface and the lower surface that are arranged successively, and an edge of the upper surface of the at least one second structural part forms a second closed connection line; and wherein the first closed connection line and the second closed connection line do not completely overlap.

* * * * *